United States Patent
Lee

(10) Patent No.: US 12,356,741 B2
(45) Date of Patent: *Jul. 8, 2025

(54) SPLIT FLOATING DIFFUSION PIXEL LAYOUT DESIGN

(71) Applicant: OMNIVISION TECHNOLOGIES, INC., Santa Clara, CA (US)

(72) Inventor: Sangjoo Lee, Sunnyvale, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 383 days.

This patent is subject to a terminal disclaimer.

(21) Appl. No.: 18/051,437

(22) Filed: Oct. 31, 2022

(65) Prior Publication Data

US 2024/0145501 A1    May 2, 2024

(51) Int. Cl.
*H10F 39/00*    (2025.01)
*H10F 39/18*    (2025.01)

(52) U.S. Cl.
CPC ..... *H10F 39/80373* (2025.01); *H10F 39/182* (2025.01); *H10F 39/8023* (2025.01); *H10F 39/807* (2025.01)

(58) Field of Classification Search
CPC ............. H10F 39/80373; H10F 39/182; H10F 39/8023; H10F 39/807; H10F 39/802–80377; H10F 39/191–195; H10F 39/18–1898; H10D 89/921; H10D 44/40–478; H10D 84/014–0142; H10D 30/611; H10D 30/615; H10D 84/0177; H04N 25/76; G09G 2300/0452; G09G 2300/0478–0495

See application file for complete search history.

(56) References Cited

U.S. PATENT DOCUMENTS

| | | | |
|---|---|---|---|
| 6,657,665 B1 | 12/2003 | Guidash | |
| 2016/0372504 A1* | 12/2016 | Kato | H10F 39/813 |
| 2019/0341411 A1* | 11/2019 | Lim | H04N 25/772 |

(Continued)

FOREIGN PATENT DOCUMENTS

| | | |
|---|---|---|
| CN | 212033025 U | 11/2020 |
| CN | 216435905 U | 5/2022 |

(Continued)

OTHER PUBLICATIONS

U.S. Appl. No. 18/051,351, filed Oct. 31, 2022, Lee

*Primary Examiner* — Shahed Ahmed
(74) *Attorney, Agent, or Firm* — Perkins Coie LLP; Daniel L. Jackstadt

(57) ABSTRACT

A pixel array includes pixel circuits including a first pixel circuit having a first split floating diffusion receiving charge from first and third photodiodes through first and third transfer transistors, and a second split floating diffusion receiving the charge from second and fourth photodiodes through second and fourth transfer transistors. A first shared gate structure includes gates of first transfer transistors of first and second pixel circuits. A third shared gate structure includes gates of third transfer transistors of the first and second pixel circuits. A second shared gate structure includes gates of second transfer transistors of first and third pixel circuit. A fourth shared gate structure includes gates of fourth transfer transistors the first and third pixel circuits.

41 Claims, 12 Drawing Sheets

(56) References Cited

U.S. PATENT DOCUMENTS

| | | | |
|---|---|---|---|
| 2019/0363119 A1* | 11/2019 | Kwag | H04N 25/77 |
| 2020/0119082 A1* | 4/2020 | Lee | H10F 39/807 |
| 2020/0243593 A1 | 7/2020 | Xu et al. | |
| 2021/0250529 A1* | 8/2021 | Baek | H04N 25/583 |
| 2021/0358994 A1 | 11/2021 | Lee et al. | |
| 2021/0360175 A1 | 11/2021 | Dai et al. | |
| 2024/0006431 A1* | 1/2024 | Machida | H01L 27/14614 |

FOREIGN PATENT DOCUMENTS

| | | | | |
|---|---|---|---|---|
| CN | 217283139 U | 8/2022 | | |
| CN | 217607878 U | 10/2022 | | |
| JP | 2014143444 A | * | 8/2014 | H01L 27/14603 |

* cited by examiner

|        | ODD | EVEN | | ODD | | EVEN | | ODD |
|--------|-----|------|---|-----|---|------|---|-----|
| TX_N+3 | 3 | 4 | 3 | 4 | 3 | 4 | 3 | 4 |
| TX_N+2 | 1 | 2 | 1 | 2 | 1 | 2 | 1 | 2 |
| TX_N+1 | 3 | 4 | 4 | 3 | 3 | 4 | 4 | 3 |
| TX_N   | 1 | 2 | 2 | 1 | 1 | 2 | 2 | 1 |
| TX_N+3 | 3 | 4 | 3 | 4 | 3 | 4 | 3 | 4 |
| TX_N+2 | 1 | 2 | 1 | 2 | 1 | 2 | 1 | 2 |
| TX_N+1 | 3 | 4 | 4 | 3 | 3 | 4 | 4 | 3 |
| TX_N   | 1 | 2 | 2 | 1 | 1 | 2 | 2 | 1 |

|        | ODD | EVEN |   | ODD |   | EVEN |   | ODD |
|--------|-----|------|---|-----|---|------|---|-----|
| TX_N+3 | 3   | 4    | 1 | 2   | 3 | 4    | 3 | 4   |
| TX_N+2 | 1   | 2    | 3 | 4   | 1 | 2    | 1 | 2   |
| TX_N+1 | 3   | 4    | 4 | 3   | 3 | 4    | 4 | 3   |
| TX_N   | 1   | 2    | 2 | 1   | 1 | 2    | 2 | 1   |
| TX_N+3 | 3   | 4    | 3 | 4   | 3 | 4    | 3 | 4   |
| TX_N+2 | 1   | 2    | 1 | 2   | 1 | 2    | 1 | 2   |
| TX_N+1 | 3   | 4    | 4 | 3   | 3 | 4    | 4 | 3   |
| TX_N   | 1   | 2    | 2 | 1   | 1 | 2    | 2 | 1   |

*FIG. 3C*

SPLIT FLOATING DIFFUSION PIXEL LAYOUT DESIGN

BACKGROUND INFORMATION

Field of the Disclosure

This disclosure relates generally to image sensors, and in particular but not exclusively, relates to high dynamic range (HDR) complementary metal oxide semiconductor (CMOS) image sensors.

Background

Image sensors have become ubiquitous and are now widely used in digital cameras, cellular phones, security cameras as well as in medical, automotive, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing. The technology used to manufacture image sensors has continued to advance at a great pace. For example, the demands of higher resolution and lower power consumption have encouraged the further miniaturization and integration of these devices.

A typical complementary metal oxide semiconductor (CMOS) image sensor operates in response to image light from an external scene being incident upon the image sensor. The image sensor includes an array of pixels having photosensitive elements (e.g., photodiodes) that absorb a portion of the incident image light and photogenerate image charge upon absorption of the image light. The image charge photogenerated by the pixels may be measured as analog output image signals on column bitlines that vary as a function of the incident image light. In other words, the amount of image charge photogenerated is proportional to the intensity of the image light, which are read out as analog signals from the column bitlines and converted to digital values to produce digital images (i.e., image data) that represent the external scene.

Standard image sensors have a limited dynamic range of approximately 60 to 70 dB. However, the luminance dynamic range of the real world is much larger. For instance, natural scenes often span a range of 90 dB and greater. In order to capture details in bright highlights and dim shadows simultaneously, high dynamic range (HDR) technologies have been used in image sensors to increase the captured dynamic range.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 3B illustrates a first readout period of an example pixel array of pixel circuits having shared gate structures with split floating diffusions in accordance with the teachings of the present invention.

FIG. 3C illustrates a second readout period of an example pixel array of pixel circuits having shared gate structures with split floating diffusions in accordance with the teachings of the present invention.

Figure 1:
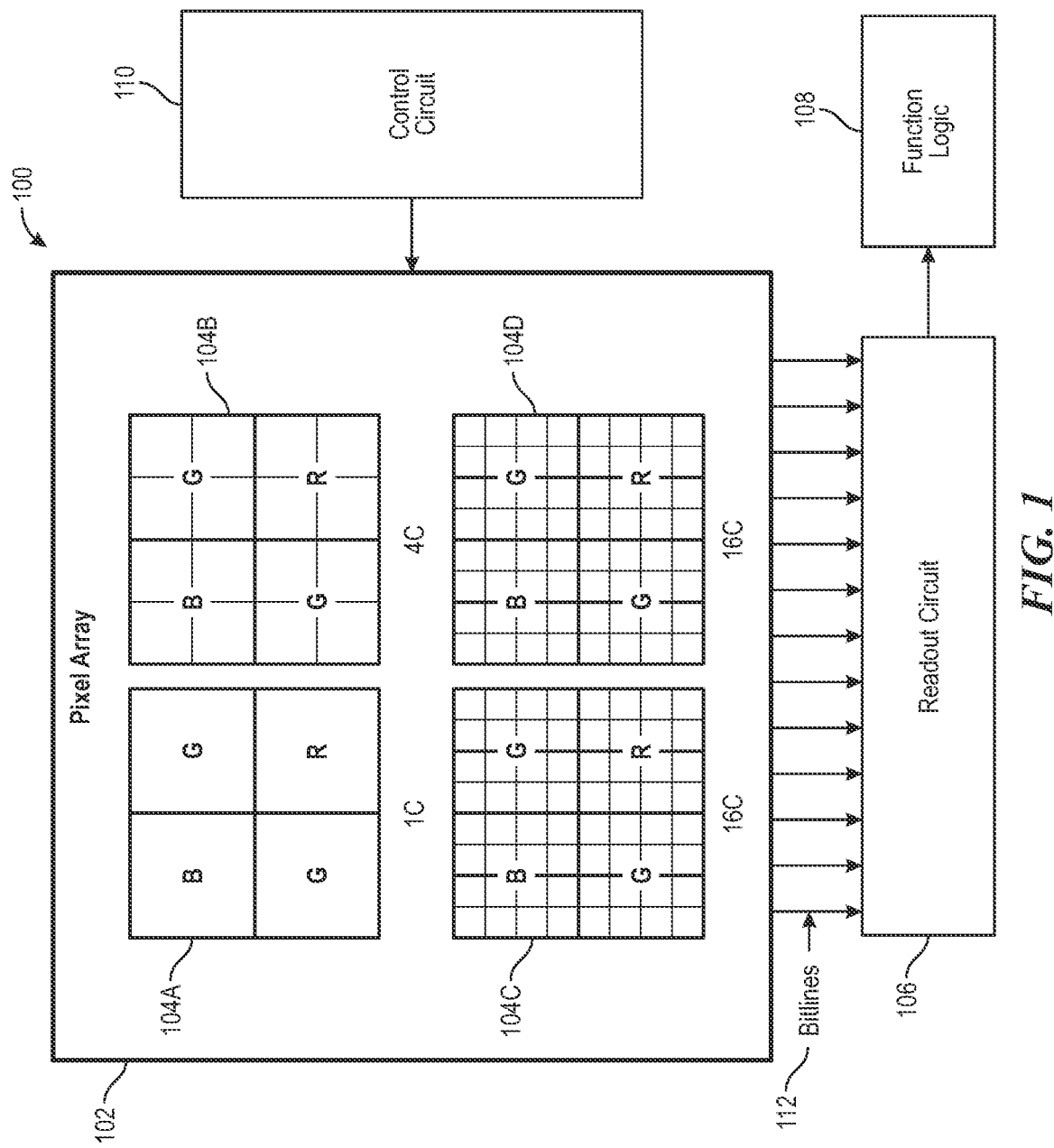
FIG. 1 illustrates one example of an imaging system including an array of pixel circuits organized in a variety of different color patterns in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Examples directed to an imaging system with pixel circuits having shared gate structures with split floating diffusions included in a pixel array in accordance with the teachings of the present invention are described herein. In the following description, numerous specific details are set forth to provide a thorough understanding of the examples.

One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system including a pixel array of pixel circuits with shared gate structures and split floating diffusions are disclosed. In the various examples, each pixel circuit includes first, second, third, and fourth photodiodes disposed in a semiconductor material that configured to photogenerate charge in response to incident light. First, second, third, and fourth transfer transistors are coupled to the first, second, third, and fourth photodiodes, respectively, and a first split floating diffusion and a second split floating diffusion are disposed in the semiconductor material. As such, the first split floating diffusion is coupled to receive the charge photogenerated by the first and third photodiodes through the first and third transfer transistors, respectively, and the second split floating diffusion is coupled to receive the charge photogenerated by the second and fourth photodiodes through the second and fourth transfer transistors, respectively.

Each pixel circuit also includes first, second, third, and fourth shared gate structures. The first shared gate structure includes a gate of the first transfer transistor of a first pixel circuit and a gate of a first transfer transistor of a second pixel circuit of the plurality of pixel circuits. The third shared gate structure includes a gate of the third transfer transistor of the first pixel circuit and a gate of a third transfer transistor of the second pixel circuit. The second shared gate structure includes a gate of the second transfer transistor of the first pixel circuit and a gate of a second transfer transistor of a third pixel circuit of the plurality of pixel circuits. The fourth shared gate structure includes a gate of the fourth transfer transistor of the first pixel circuit and a gate of a fourth transfer transistor of the third pixel circuit. In the various examples, a first pixel circuit is disposed in the semiconductor material between the second pixel circuit and the third pixel circuit such that the first, second, and third pixel circuits are neighboring pixel circuits in the pixel array. In the examples, each pixel circuit further includes a source follower transistor disposed in the semiconductor material between the first and second split floating diffusions. As such, each pixel circuit also includes a conductor disposed over a gate of the source follower transistor and the first and second split floating diffusions so that the gate of the source follower transistor is coupled to the first and second split floating diffusions through the conductor.

As such, it is appreciated that pixel circuits in accordance with the teachings of the present invention feature a pixel design that divides the floating diffusion surrounded by four adjacent transfer transistors into two parts. With the shared gate structure, the gates of transfer transistors of pixel circuits have a merged TX gates (e.g., a shared transfer gate structure among multiple transfer transistors) between neighboring pixel circuits, which enables a single metal interconnection for a transfer control signal to be shared between adjacent pixel circuits. Thus, metal wiring complexity is reduced and routing flexibility is also provided. For example, wider metal spacing is provided for pixel scaling benefit. In one example, pixel sizing may be reduced down to 0.5 um. With the source follower transistor disposed in the semiconductor material between the first and second split diffusions, the conductor's path length from the first split floating diffusion to the gate of the source follower transistor to the second split floating diffusion may be reduced, which enables the pitch of pixel circuit design to be reduced, while still allowing shared pixel structures such as 2×2, 2×4, or higher in accordance with the teachings of the present invention. In addition, the pixel design provides flexibility that allows high dynamic range, switchable multi-conversion gain, multi-pixel binning, phase detection auto-focus, high speed readouts via multiple bitlines as well as dual row select configurations.

To illustrate, FIG. 1 illustrates generally one example of a complementary metal oxide semiconductor (CMOS) imaging system 100 including a pixel array 102 with an array of pixel circuits with dual row select pixels for fast pixel binning in accordance with an embodiment of the present disclosure. As shown in the depicted example, the imaging system 100 includes an image sensor with pixel array 102, bitlines 112, a control circuit 110, a readout circuit 106, and function logic 108. In one example, pixel array 102 is a two-dimensional (2D) array of pixel circuits.

In the examples, the pixel circuits included in pixel array 102 may be organized in one of a variety of different color patterns. For instance, the array of color pixel circuits 104A illustrates an example of a 1C Bayer (RGB) color filter pattern, which may be utilized for high resolution still image capture. Similarly, the array of color pixel circuits 104B illustrates an example of a 4C (2×2) Bayer color filter pattern of red (R), green (G), and blue (B) color filters as shown. The array of color pixel circuits 104C illustrates an example of a 16C (4×4) Bayer (RGB) color filter pattern. It is noted that the color pixel circuits 104C in the depicted example are organized as neighboring pairs of 2×4 pixel circuits to form the 4×4 16C Bayer (RGB) color filter pattern. The array of color pixel circuits 104D illustrates another example of a 16C (4×4) Bayer (RGB) color filter pattern, which may be utilized for example for high speed HD video capture.

In the depicted example, the pixel circuits included in pixel array 102 are arranged into rows and columns to acquire image data of a person, place, object, etc., which can then be used to render an image of a person, place, object, etc. After the photodiodes in the pixel circuits of pixel array 102 have acquired their image charge, the corresponding analog image signals are read out by readout circuit 106 through column bitlines 112. In various examples, the pixel circuits included in pixel array 102 may also be configured to provide high dynamic range (HDR) image signals, in which case, the image charge generated by the one or more photodiodes in bright lighting conditions may also be transferred to lateral overflow integration capacitors (LOFICs) and/or an additional floating diffusion to store the image charge. For example, each pixel circuit 104 may include a LOFIC configured to store excess image charges that overflow from the coupled one or more photodiodes during an integration period. In various examples, readout circuit 106 may include current sources, routing circuitry, and comparators that may be included in analog to digital converters or otherwise.

In the various examples, readout circuit 106 includes an analog-to-digital conversion (ADC) circuits, which are coupled to convert the analog image signals received from the pixel circuits 104 through bitlines 112 into digital image signals, which may be then transferred to function logic 108. Function logic 108 may simply store the digital image data or even manipulate the digital image data by applying post image effects (e.g., crop, rotate, remove red eye, adjust brightness, adjust contrast, or otherwise).

In one example, control circuit 110 is coupled to pixel array 102 to control operation of the plurality of photodiodes in pixel array 102. For example, control circuit 110 may generate a rolling shutter or a shutter signal for controlling image acquisition. In other examples, image acquisition is synchronized with lighting effects such as a flash.

In one example, imaging system 100 is implemented on a single semiconductor wafer. In another example, imaging system 100 is on stacked semiconductor wafers. For example, pixel array 102 is implemented on a pixel wafer, and readout circuit 106, control circuit 110 and function logic 108 are implemented on an application specific integrated circuit (ASIC) wafer, where the pixel wafer and the ASIC wafer are stacked and interconnected by bonding (hybrid bonding, oxide bonding, or the like) or one or more through substrate vias (TSVs). For another example, pixel array 102 and control circuit 110 are implemented on a pixel wafer, and readout circuit 106, and function logic 108 are implemented on an ASIC wafer, where the pixel wafer and the ASIC wafer are stacked and interconnected by bonding (hybrid bonding, oxide bonding, or the like) or one or more through substrate vias (TSVs).

In one example, imaging system 100 may be included in a digital device, cell phone, laptop computer, an endoscope, a security camera, or an imaging device for automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100.

Figure 2A:
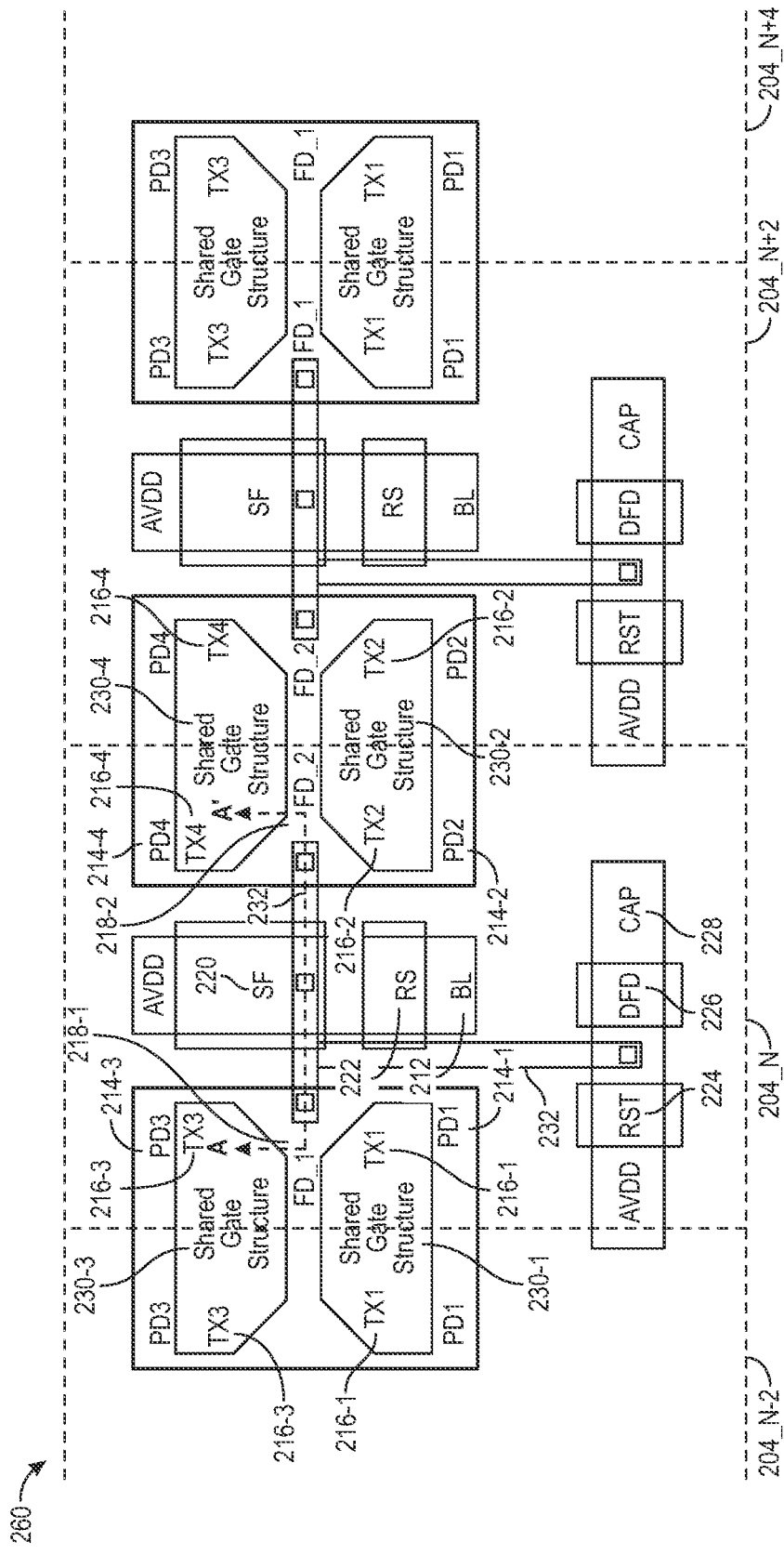
FIG. 2A shows a plan view of an example layout of an arrangement of pixel circuits having shared gate structures with split floating diffusions included in a pixel array in accordance with the teachings of the present invention.

FIG. 2A shows a plan view of an example layout of an arrangement of pixel circuits 204_N, 204_N−2, 204_N+2, 204_N+4 . . . etc. having shared gate structures with split floating diffusions that are included in a pixel array in accordance with the teachings of the present invention. It is appreciated that the pixel circuits 204_N, 204_N−2, 204_N+2, 204_N+4 . . . etc. of FIG. 2A may be examples of neighboring pixel circuits that are included in pixel array 102 as shown in FIG. 1, and that similarly named and numbered elements described above are coupled and function similarly below. In the various examples, first pixel circuit 204_N, second pixel circuit 204_N−2, and third pixel circuit 204_N+2, etc. are substantially similar to one another. As such, it is therefore appreciated that descriptions of features and functions in first pixel circuit 204_N are applicable to the corresponding features and functions included in the other pixel circuits in the pixel array, including the second pixel circuit 204_N−2 and third pixel circuit 204_N+2, etc.

As shown in the example depicted in FIG. 2A, first pixel circuit 204_N is disposed in semiconductor material 260 (e.g., silicon substrate material) between second pixel circuit 204_N−2 and third pixel circuit 204_N+2. In one example, first pixel circuit 204_N, second pixel circuit 204_N−2, and third pixel circuit 204_N+2 have a pixel pitch of a submicron range such as 0.5 um or less. As shown, first pixel circuit 204N includes first, second, third, and fourth photodiodes PD1 214-1, PD2 214-2, PD3 214-3, and PD4 214-4 disposed in semiconductor material 260 and are configured to photogenerate charge in response to incident light. First, second, third, and fourth transfer transistors TX1 216-1, TX2 216-2, TX3 216-3, and TX4 216-4 of first pixel circuit 204_N are coupled to the first, second, third, and fourth photodiodes PD1 214-1, PD2 214-2, PD3 214-3, and PD4 214-4, respectively. First and second split floating diffusions FD_1 218-1 and FD_2 218-2 of first pixel circuit 204_N are disposed in the semiconductor material 260. The first split floating diffusion FD_1 218-1 is coupled to receive the charge photogenerated by the first and third photodiodes PD1 214-1 and PD3 214-3 through the first and third transfer transistors TX1 216-1 and TX3 216-3, respectively. The first split floating diffusion FD_1 218-1 may be disposed in the semiconductor material 260 proximate to the first and third transfer transistors TX1 216-1 and TX3 216-3 in the first pixel circuit 204_N. Similarly, the second split floating diffusion FD_2 218-2 is coupled to receive the charge photogenerated by the second and fourth photodiodes PD2 214-2 and PD4 214-4 through the second and fourth transfer transistors TX2 216-2 and TX4 216-4, respectively. The second split floating diffusion FD_2 218-2 may be disposed in the semiconductor material 260 proximate to the second and fourth transfer transistors TX2 216-2 and TX4 216-4 in the first pixel circuit 204_N.

Continuing with the example depicted in FIG. 2A, first pixel circuit 204_N also includes first, second, third, and fourth shared gate structures 230-1, 230-2, 230-3, and 230-4. The first shared gate structure 230-1 includes a gate (e.g., gate electrode) of the first transfer transistor TX1 216-1 of the first pixel circuit 204_N and a gate (e.g., gate electrode) of a first transfer transistor TX1 216-1 of the neighboring second pixel circuit 204_N−2. The gate (e.g., gate electrode) of the first transfer transistor TX1 216-1 of the first pixel circuit 204N and the gate (e.g., gate electrode) of the first transfer transistor TX1 216-1 of the neighboring second pixel circuit 204_N−2 are formed as a single or monolithic gate electrode. The gate (e.g., gate electrode) of the first transfer transistor TX1 216-1 of the first pixel circuit 204N is configured to couple the first photodiode 214-1 to the first split floating diffusion FD_1 218-1. The gate (e.g., gate electrode) of first transfer transistor TX1 216-1 of the neighboring second pixel circuit 204_N−2 is configured to couple the first photodiode 214-1 of the neighboring second pixel circuit 204_N−2 to the respective first split floating diffusion FD_1. The first shared gate structure 230-1 enables the gate (e.g., gate electrode) of the first transfer transistor TX1 216-1 of the first pixel circuit 204_N and the gate (e.g., gate electrode) of the first transfer transistor TX1 216-1 of the neighboring second pixel circuit 204_N−2 to share a single metal interconnection (e.g., signal metal 1 interconnect) that is coupled to receive first transfer control signal.

The third shared gate structure 230-3 includes a gate (e.g., gate electrode) of the third transfer transistor TX3 216-3 of the first pixel circuit 204_N and a gate (e.g., gate electrode) of a third transfer transistor TX3 216-3 of the neighboring second pixel circuit 204_N−2. The gate (e.g., gate electrode) of the third transfer transistor TX3 216-3 of the first pixel circuit 204_N and the gate (e.g., gate electrode) of the third transfer transistor TX3 216-3 of the neighboring second pixel circuit 204_N−2 are formed as a single or monolithic gate electrode. The gate (e.g., gate electrode) of the third transfer transistor TX3 216-3 of the first pixel circuit 204_N is configured to couple the third photodiode 214-3 to the first split floating diffusion FD_1 218-1 of the first pixel circuit 204. The gate (e.g., gate electrode) of third transfer transistor TX3 216-3 of the neighboring second pixel circuit 204_N−2 is configured to couple the respective third photodiode 214-3 of the neighboring second pixel circuit 204_N−2 to the respective first split floating diffusions FD_1. The third shared gate structure 230-3 enables the gate (e.g., gate electrode) of the third transfer transistor TX3 216-3 of the first pixel circuit 204_N and the gate (e.g., gate electrode) of the third transfer transistor TX3 216-3 of the neighboring second pixel circuit 204_N−2 to share a single metal interconnection (e.g., signal metal 1 interconnect) that is coupled to receive a third transfer control signal.

The second shared gate structure 230-2 includes a gate (e.g., gate electrode) of the second transfer transistor TX2 216-2 of the first pixel circuit 204_N and a gate (e.g., gate electrode) of a second transfer transistor TX2 216-2 of the neighboring third pixel circuit 204_N+2. The gate (e.g., gate electrode) of the second transfer transistor TX2 216-2 of the first pixel circuit 204_N and the gate (e.g., gate electrode) of the second transfer transistor TX2 216-2 of the neighboring third pixel circuit 204_N+2 are formed as a single or monolithic gate electrode. The gate (e.g., gate electrode) of the second transfer transistor TX2 216-2 of the first pixel circuit 204N is configured to couple the second photodiode 214-2 to the second split floating diffusion FD_2 218-2. The gate (e.g., gate electrode) of second transfer transistor TX2 216-2 of the neighboring third pixel circuit 204_N+2 is configured to couple the second photodiode 214-2 of the neighboring third pixel circuit 204_N+2 to the respective second split floating diffusion FD_2. The second shared gate structure 230-2 enables the gate (e.g., gate electrode) of the second transfer transistor TX2 216-2 of the first pixel circuit 204N and the gate (e.g., gate electrode) of the second transfer transistor TX2 216-2 of the neighboring third pixel circuit 204_N+2 to share a single metal interconnection (e.g., signal metal 1 interconnect) that is coupled to receive a second transfer control signal.

The fourth shared gate structure 230-4 includes a gate (e.g., gate structure) of the fourth transfer transistor TX4 216-4 of the first pixel circuit 204_N and a gate (e.g., gate structure) of a fourth transfer transistor TX4 216-4 of the neighboring third pixel circuit 204_N+2. The gate (e.g., gate structure) of the fourth transfer transistor TX4 216-4 of the first pixel circuit 204_N and the gate (e.g., gate structure) of the fourth transfer transistor TX4 216-4 of the neighboring third pixel circuit 204_N+2 are formed as a single or monolithic gate electrode. The gate (e.g., gate electrode) of the fourth transfer transistor TX4 216-4 of the first pixel circuit 204N is configured to couple the fourth photodiode 214-4 to the second split floating diffusion FD_2 218-2. The gate (e.g., gate electrode) of fourth transfer transistor TX4 216-4 of the neighboring third pixel circuit 204_N+2 is configured to couple the fourth photodiode 214-4 of the neighboring third pixel circuit 204_N+2 to the respective second split floating diffusion FD_2 of the neighboring third pixel circuit 204_N+2. The fourth shared gate structure 230-4 enables the gate (e.g., gate structure) of the fourth transfer transistor TX4 216-4 of the first pixel circuit 204_N and the gate (e.g., gate structure) of the fourth transfer transistor TX4 216-4 of the neighboring third pixel circuit 204_N+2 to share a single metal interconnection (e.g., signal metal 1 interconnect) that is coupled to receive a fourth transfer control signal.

As shown in the depicted example, first pixel circuit 204N also includes a source follower transistor SF 220 that is disposed in the semiconductor material 260 between the first and second split floating diffusions FD_1 218-1 and FD_2 218-2. A conductor 232 is disposed over and coupled to a gate of the source follower transistor SF 220 and the first and second split floating diffusions FD_1 218-1 and FD_2 218-2 through respective contacts. As such, the gate of the source follower transistor SF 220 is coupled to the first and second split floating diffusions FD_1 218-1 and FD_2 218-2 through the conductor 232. It is appreciated that with the gate of the source follower transistor SF 220 in relatively close proximity to the first and second split floating diffusions FD_1 218-1 and FD_2 218-2 as shown, the routing of the conductor 232 is relatively short and simple, which helps to allow the pitch of the pixel circuits to be relatively small. For instance, in one example, the pitch of first, second, and third pixel circuits 204_N, 204_N−2, 204_N+2 is approximately only 0.5 um. In other examples, it is appreciated that the pitch of first, second, and third pixel circuits 204_N, 204_N−2, 204_N+2 may have different values. In addition, it is appreciated that a shorter length of the conductor 232 and a lower parasitic capacitance associated with the first and second split floating diffusions FD_1 218-1 and FD_2 218-2 are provided in accordance with the teachings of the present disclosure, which allows the first pixel circuit 204_N to have higher conversion gain. Continuing with the depicted example, first pixel circuit 204_N also includes a row select transistor RS 222 that is coupled to the source follower transistor SF 220 such that the source follower transistor SF 220 and the row select transistor RS 222 are coupled between a power line AVDD and a bitline BL 212.

In the example depicted in FIG. 2A, first pixel circuit 204N also includes a reset transistor RST 224 coupled between the power line AVDD and the first and second split floating diffusions FD_1 218-1 and FD_2 218-2. As shown, the conductor 232 is further coupled between the first and second split floating diffusions FD_1 218-1 and FD_2 218-2, as well as to the gate of source follower transistor SF 220 and the source of the reset transistor RST 224. The example also shows that first pixel circuit 204_N further includes a capacitor CAP 228 and a dual floating diffusion transistor DFD 226 coupled between the capacitor CAP 228 and the first and second split floating diffusions FD_1 218-1 and FD_2 218-2 through conductor 232.

Figure 2B:
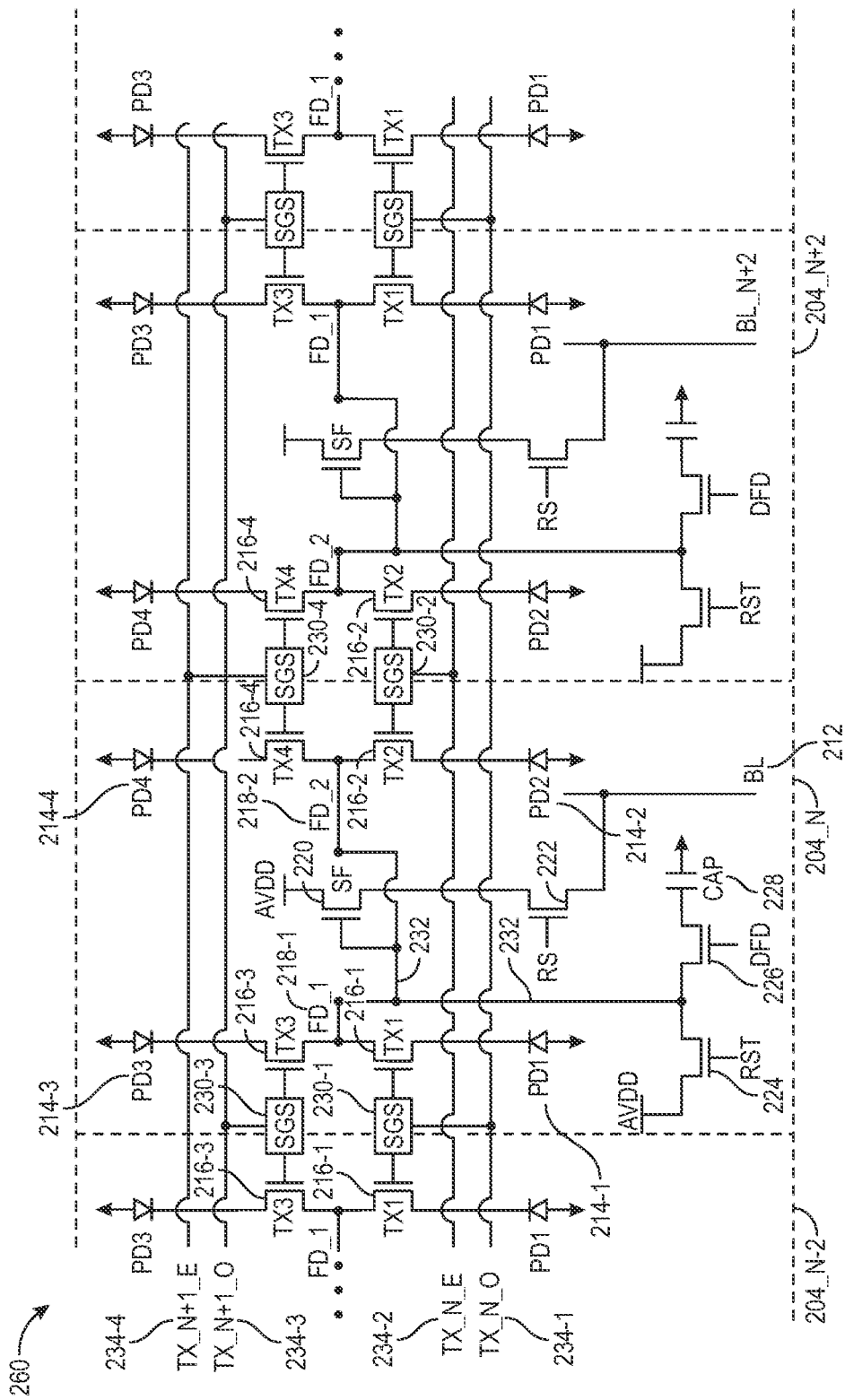
FIG. 2B shows a schematic of an example arrangement of pixel circuits having shared gate structures with split floating diffusions included in a pixel array in accordance with the teachings of the present invention.

FIG. 2B shows a schematic representation of the example arrangement of pixel circuits 204_N, 204_N−2, 204_N+2 having shared gate structures with split floating diffusions included in a pixel array in accordance with the teachings of the present invention. It is appreciated that the pixel circuits 204_N, 204_N−2, 204_N+2 of FIG. 2B correspond with the plan view representation of pixel circuits 204_N, 204_N−2, 204_N+2 depicted in FIG. 2A, which may also be examples of neighboring pixel circuits that are included in pixel array 102 as shown in FIG. 1. Accordingly, similarly named and numbered elements described above are coupled and function similarly below. As can be observed in the various examples, first pixel circuit 204_N, second pixel circuit 204_N−2, and third pixel circuit 204_N+2 are substantially similar to one another. As such, it is therefore appreciated that descriptions of features and functions in first pixel circuit 204_N are applicable to the corresponding features and functions included in the other pixel circuits in the pixel array, including the second pixel circuit 204_N−2 and third pixel circuit 204_N+2.

As shown in the example depicted in FIG. 2B, first pixel circuit 204_N is disposed in semiconductor material 260 between second pixel circuit 204_N−2 and third pixel circuit 204_N+2. In operation, each of the first, second, third, and fourth photodiodes PD1 214-1, PD2 214-2, PD3 214-3, and PD4 214-4 of each of the pixel circuits is configured to photogenerate image charge in response to incident light. In the depicted example, the first split floating diffusion FD_1 218-1 is coupled to receive the image charge from the first photodiode PD1 214-1 through the first transfer transistor TX1 216-1 and from the third photodiode PD3 214-3 through the third transfer transistor TX3 216-3. Similarly, the second split floating diffusion FD_2 218-2 is coupled to receive the image charge from the second photodiode PD2 214-2 through the second transfer transistor TX2 216-2 and from the fourth photodiode PD4 214-4 through the fourth transfer transistor TX4 216-4.

Continuing with the example depicted in FIG. 2B, first pixel circuit 204_N also includes first, second, third, and fourth shared gate structures SGS 230-1, SGS 230-2, SGS 230-3, and SGS 230-4. The first shared gate structure SGS 230-1 includes a gate (e.g., gate electrode) of the first transfer transistor TX1 216-1 of the first pixel circuit 204_N and a gate (e.g., gate electrode) of a first transfer transistor TX1 216-1 of the neighboring second pixel circuit 204_N−2. The third shared gate structure SGS 230-3 includes a gate (e.g., gate electrode) of the third transfer transistor TX3 216-3 of the first pixel circuit 204_N and a gate (e.g., gate electrode) of a third transfer transistor TX3 216-3 of the neighboring second pixel circuit 204_N−2. The second shared gate structure SGS 230-2 includes a gate (e.g., gate electrode) of the second transfer transistor TX2 216-2 of the first pixel circuit 204_N and a gate (e.g., gate electrode) of a second transfer transistor TX2 216-2 of the neighboring third pixel circuit 204_N+2. The fourth shared gate structure SGS 230-4 includes a gate (e.g., gate structure) of the fourth transfer transistor TX4 216-4 of the first pixel circuit 204_N and a gate (e.g., gate structure) of a fourth transfer transistor TX4 216-4 of the neighboring third pixel circuit 204_N+2.

As shown in the depicted example, first pixel circuit 204N also includes a source follower transistor SF 220 that is disposed in the semiconductor material 260 between the first and second split floating diffusions FD_1 218-1 and FD_2 218-2. A conductor 232 is coupled to a gate of the source follower transistor SF 220 and the first and second split floating diffusions FD_1 218-1 and FD_2 218-2. In the example, first pixel circuit 204_N also includes a row select transistor RS 222 that is coupled to the source follower transistor SF 220 such that the source follower transistor SF 220 and the row select transistor RS 222 are coupled between a power line AVDD and a bitline BL 212. First pixel circuit 204_N also includes a reset transistor RST 224 coupled between the power line AVDD and the first and second split floating diffusions FD_1 218-1 and FD_2 218-2. As shown, the conductor 232 is further coupled between the first and second split floating diffusions FD_1 218-1 and FD_2 218-2, as well as the gate of source follower transistor SF 220 and the reset transistor RST 224 (e.g., the source of the reset transistor RST 224).

The example also shows that first pixel circuit 204_N further includes a capacitor CAP 228 and a dual floating diffusion transistor DFD 226 coupled between the capacitor CAP 228 and the first and second split floating diffusions FD_1 218-1 and FD_2 218-2 through conductor 232. In one example, the capacitor CAP 228 may be a lateral overflow integration capacitor (LOFIC), which in one example may be implemented with a metal-insulator-metal capacitor including a high dielectric or high-k insulating material disposed between a first metal electrode and a second metal electrode. In various examples, the insulating material disposed between the first metal electrode and the second metal electrode of the CAP 228 may be formed of a single layer of high-k material or a multiple layer stack of high-k material. The exact composition and an overall thickness of high-k material may depend on the desired LOFIC capacitance. In the various examples, high-k material may include one of aluminum oxide ($Al_2O_3$), Zirconium dioxide ($ZrO_2$), Hafnium oxide (HfO), or a combination thereof.

In the illustrated example, the first shared gate structure SGS 230-1 is coupled to receive a first transfer control signal TX_N_O 234-1. In the example, the first transfer control signal TX_N_O 234-1 is coupled to be received by shared gate structures (e.g., SGS 230-1, etc.) in "odd" numbered columns of the shared gate structures in the pixel array that are in the same row as the first and second gate structures SGS 230-1 and SGS 230-2. Similarly, the second shared gate structure SGS 230-2 is coupled to receive a second transfer control signal TX_N_E 234-2. In the example, the second transfer control signal TX_N_E 234-2 is coupled to be received by shared gate structures (SGS 230-2, etc.) in "even" numbered columns of the shared gate structures in the pixel array that are in the same row as the first and second gate structures SGS 230-1 and SGS 230-2.

Continuing with the depicted example, the third shared gate structure SGS 230-3 is coupled to receive a third transfer control signal TX_N+1_O 234-3. In the depicted example, the third transfer control signal TX_N+1_O 234-3 is coupled to be received by shared gate structures (e.g., SGS 230-3, etc.) in "odd" numbered columns of the shared gate structures in the pixel array in a same row as the third and fourth gate structures SGS 230-3 and SGS 230-4. In the example, the fourth shared gate structure SGS 230-4 is coupled to receive a fourth transfer control signal TX_N+1_E 234-4. In the depicted example, the fourth transfer control signal TX_N+1_E 234-4 is coupled to be received by shared gate structures (e.g., SGS 230-4, etc.) in even numbered columns of the shared gate structures in the pixel array that are in the same row as the third and fourth gate structures SGS 230-3 and SGS 230-4.

As such, the first transfer transistor TX1 216-1 of the first pixel circuit 204_N (as well as the first transfer transistor TX1 216-1 of the neighboring second pixel circuit 204_N−2) are coupled to be controlled in response to the first transfer control signal TX_N_O 234-1. During a readout operation, charge that is photogenerated in the first photodiode PD1 214-1 is configured to be transferred from the first photodiode PD1 214-1 through first transfer transistor TX1 216-1 to the first split floating diffusion FD_1 218-1 in response to the first transfer control signal TX_N_O 234-1. The second transfer transistor TX2 216-2 of the first pixel circuit 204_N (as well as the second transfer transistor TX2 216-2 of the neighboring third pixel circuit 204_N+2) are coupled to be controlled in response to the second transfer control signal TX_N_E 234-2. During a readout operation, charge that is photogenerated in the second photodiode PD2 214-2 is configured to be transferred from the second photodiode PD2 214-2 through second transfer transistor TX2 216-2 to the second split floating diffusion FD_2 218-2 in response to the second transfer control signal TX_N_E 234-2.

Similarly, the third transfer transistor TX3 216-3 of the first pixel circuit 204N (as well as the third transfer transistor TX3 216-3 of the neighboring second pixel circuit 204_N−2) are coupled to be controlled in response to the third transfer control signal TX_N_O 234-1. During a readout operation, charge that is photogenerated in the third photodiode PD3 214-3 is configured to be transferred from the third photodiode PD3 214-3 through third transfer transistor TX3 216-3 to the first split floating diffusion FD_1 218-1 in response to the third transfer control signal TX_N+1_O 234-3. The fourth transfer transistor TX4 216-4 of the first pixel circuit 204_N (as well as the fourth transfer transistor TX4 216-4 of the neighboring third pixel circuit 204_N+2) are coupled to be controlled in response to the fourth transfer control signal TX_N+1_E 234-4. During a readout operation, charge that is photogenerated in the fourth photodiode PD4 214-4 is configured to be transferred from the fourth photodiode PD4 214-4 through fourth transfer transistor TX4 216-4 to the second split floating diffusion FD_2 218-2 in response to the fourth transfer control signal TX_N+1_E 234-4. In operation, the row select transistor RS 222 is coupled to output a signal (e.g., image data) from the source follower transistor SF 220 of first pixel circuit 204N to the bitline BL 212 in response a row select control signal and the charge in first and second split floating diffusions FD_1 218-1 and FD_2 218-2, which are coupled to the gate of the source follower transistor SF 220 through conductor 232 in accordance with the teachings of the present invention.

In the example illustrated in FIG. 2B, the capacitor CAP 228 is configured to receive excess image charge overflow from the first and second split floating diffusions FD_1 218-1 and FD_2 218-2 through the dual floating diffusion transistor DFD 226. The reset transistor RST 224 is coupled to the power line AVDD and configured to reset the first pixel circuit 204_N in response to a reset control signal. In operation, the first and second split floating diffusions FD_1 218-1 and FD_2 218-2 are configured to be reset through conductor 232 and reset transistor RST 224. In addition, the capacitor CAP 228 as well as the first, second, third and fourth photodiodes PD1 214-1, PD2 214-2, PD3 214-3, and PD4 214-4 may also be reset through the reset transistor RST 224 through the dual floating diffusion transistor DFD 226 as well as the first, second, third, and fourth transfer transistors TX1 216-1, TX2 216-2, TX3 216-3, and TX4 216-4 and conductor 232.

Figure 3A:
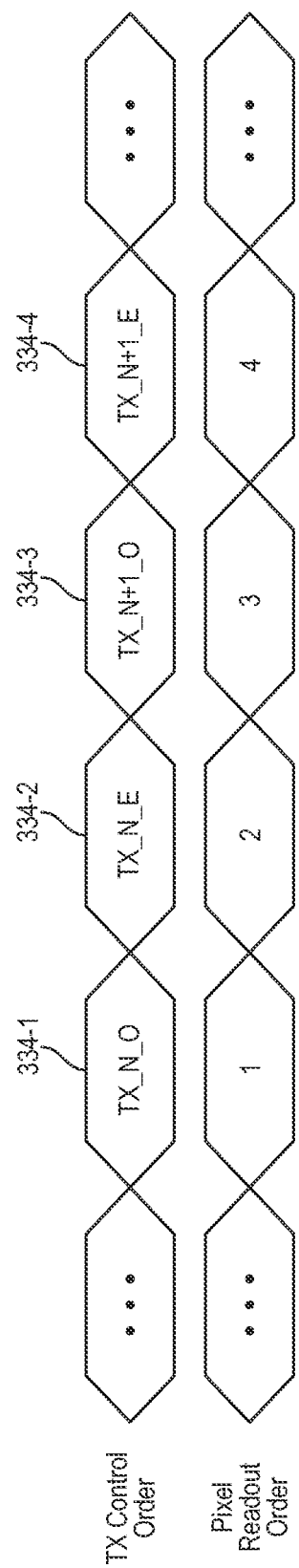
FIG. 3A illustrates a timing diagram illustrating example transfer control signals associated with the readout order of example pixel circuits having shared gate structures with split floating diffusions included in a pixel array in accordance with the teachings of the present invention.

FIG. 3A illustrates a timing diagram illustrating example transfer control signals associated with the readout order of example pixel circuits having shared gate structures with split floating diffusions included in a pixel array in accordance with the teachings of the present invention. It is appreciated that the transfer control signals and readout order depicted in FIG. 3A may be examples of the transfer control signals and readout order of the pixel circuits depicted in FIGS. 1, 2A-2B, and that similarly named and numbered elements described above are coupled and function similarly below.

As shown in the depicted example, a first transfer control signal TX_N_O 334-1 is configured to readout pixel circuits in a first readout period, and then a second transfer control signal TX_N_E 334-2 is configured to readout pixel circuits in a second readout period, and then a third transfer control signal TX_N+1_O 334-3 is configured to readout pixel circuits in a third readout period, and then a fourth transfer control signal TX_N+1_E 334-4 is configured to readout pixel circuits in a fourth readout period, etc. As shown, the second readout period occurs after the first readout period, the third readout period occurs after the second readout period, and the fourth readout period occurs after the third readout period. In one example, the cycle of readout periods repeats to readout the pixel circuits included in the pixel array. In one example, the first and third transfer control signals TX_N_O 334-1 and TX_N+1_O 334-3 are configured to control the readout of the first and third photodiodes (e.g., PD1, PD3) in odd numbered columns of the pixel array and the second and fourth transfer control signals TX_N_E 334-2 and TX_N+1_E 334-4 are configured to control the readout of the second and fourth photodiodes (e.g., PD2, PD4) in even numbered columns of the pixel array.

To illustrate, FIG. 3B illustrates a first readout period of an example pixel array 302 of pixel circuits having shared gate structures with split floating diffusions in accordance with the teachings of the present invention. It is appreciated that the pixel array 302 depicted in FIG. 3B may be one example of the pixel array 102 depicted in FIG. 1, and that the pixel circuits included in pixel array 302 may be examples of the pixel circuits depicted in FIGS. 1, 2A-2B, and that similarly named and numbered elements described above are coupled and function similarly below.

For instance, as shown in FIG. 3B, pixel array 302 includes an array of pixel circuits including pixel circuit 304_N, which is disposed between neighboring pixel circuits 304_N−2 and 304_N+2. In the example, each of the pixel circuits 304_N−2, 304_N, 304_N+2 includes four photodiodes labeled 1, 2, 3, and 4 (which correspond to photodiodes PD1 214-1, PD2 214-2, PD3 214-3, and PD4 214-4 in FIGS. 2A-2B). In the example, the photodiodes 1 and 3 in each of the pixel circuits 304_N−2, 304_N, 304_N+2 are configured to be controlled in response to the odd transfer control signals TX_N_O 334-1 and TX_N+1_O 334-3, and the photodiodes 2 and 4 in each of the pixel circuits 304_N−2, 304_N, 304_N+2 are configured to be controlled in response to the even transfer control signals TX_N_E 334-2 and TX_N+1_E 334-4.

The example depicted in FIG. 3B illustrates a first readout period during which the first photodiode 1 (e.g., PD1 214-1) of each of the pixel circuits 304_N−2, 304_N, 304_N+2 are configured to be readout in response to the first transfer control signals TX_N_O 334-1 as described above in FIG. 3A. It is appreciated that each first photodiode 1 (e.g., PD1 214-1) of each pixel circuit 304_N−2, 304_N, 304_N+2 is readout simultaneously with a corresponding first photodiode 1 (e.g., PD1 214-1) of a neighboring pixel circuit 304_N−2, 304_N, 304_N+2 because of the shared gate structure (e.g., SGS 230-1) that is coupled to control the first transfer transistor TX1 (e.g., TX1 216-1) of the neighboring pixel circuit 304_N−2, 304_N, 304_N+2 in accordance with the teachings of the present invention.

FIG. 3C illustrates a second readout period of the example pixel array 302 of pixel circuits having shared gate structures with split floating diffusions in accordance with the teachings of the present invention. Similar to FIG. 3B, it is appreciated that the pixel array 302 depicted in FIG. 3C is also one example of the pixel array 102 depicted in FIG. 1, and that the pixel circuits included in pixel array 302 may be examples of the pixel circuits depicted in FIGS. 1, 2A-2B, and that similarly named and numbered elements described above are coupled and function similarly below.

FIG. 3C illustrates a second readout period of the example pixel array 302 of pixel circuits having shared gate structures with split floating diffusions in accordance with the teachings of the present invention. As shown, during the second readout period, the second photodiode 2 (e.g., PD2 214-2) of each of the pixel circuits 304_N−2, 304_N, 304_N+2 are configured to be readout in response to the second transfer control signals TX_N_E 334-2 as described above in FIG. 3A. As shown, it is appreciated that each second photodiode 2 (e.g., PD2 214-2) of each pixel circuit 304_N−2, 304_N, 304_N+2 is readout simultaneously with a corresponding second photodiode 2 (e.g., PD2 214-2) of a neighboring pixel circuit 304_N−2, 304_N, 304_N+2 because of the shared gate structure (e.g., SGS 230-2) that is coupled to control the second transfer transistor TX2 (e.g., TX2 216-2) of the neighboring pixel circuit 304_N−2, 304_N, 304_N+2 in accordance with the teachings of the present invention. It is appreciated that in the following third readout period and in the subsequent fourth readout period, that each third photodiode 3 (e.g., PD3 214-3) and fourth photodiode 4 (e.g., PD4 214-4) are similarly readout in response to third transfer control signal TX_N+1_O 334-3 and fourth transfer control signal TX_N+1_E 334-4.

Figure 4:
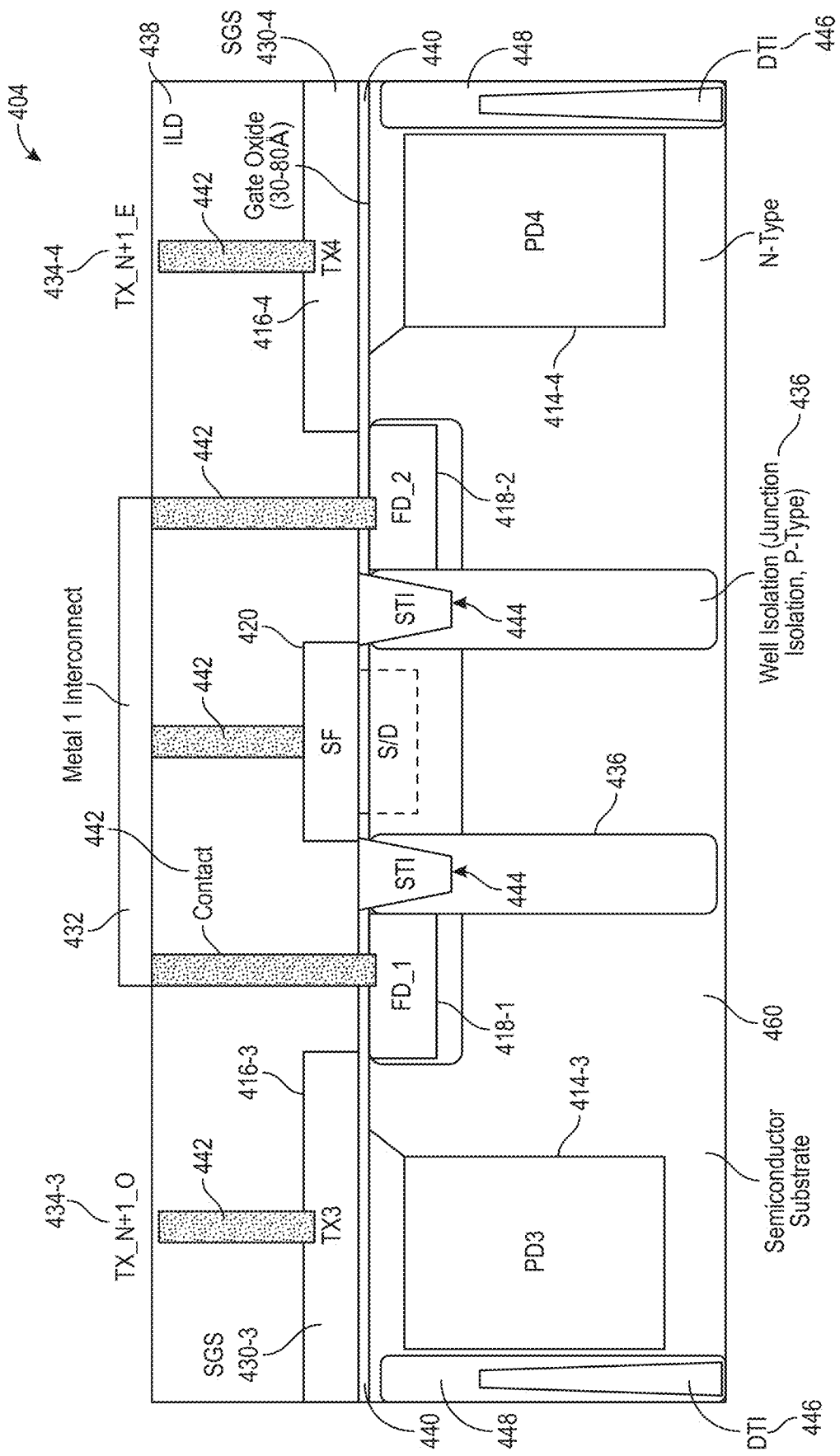
FIG. 4 shows a cross-section view of an example pixel circuit having shared gate structures with split floating diffusions included in a pixel array in accordance with the teachings of the present invention.

FIG. 4 shows a cross-section view of an example pixel circuit 404 having shared gate structures with split floating diffusions included in a pixel array in accordance with the teachings of the present invention. It is appreciated that the pixel circuit 404 depicted in FIG. 4 may be one example of one of the pixel circuits depicted above in FIGS. 1, 2A-2B, 3B-3C and that similarly named and numbered elements described above are coupled and function similarly below.

In particular, it is appreciated that the cross-section view of an example pixel circuit 404 depicted in cross-section view of an example pixel circuit 404 is a cross-section view along dashed line A-A' as shown in FIG. 2A. As shown in the example depicted in FIG. 4, pixel circuit 404 includes a plurality of photodiodes including a third photodiode PD3 414-3 and a fourth photodiode PD4 414-4 disposed in a semiconductor substrate or semiconductor material 460. In one example, third photodiode PD3 414-3 and fourth photodiode PD4 414-4 include N-type doped semiconductor material. In the example, third photodiode PD3 414-3 and fourth photodiode PD4 414-4 are configured to photogenerate charge in response to incident light.

A first split floating diffusion FD_1 418-1 and a second split floating diffusion FD_2 418-2 are disposed in the semiconductor material 460 and are configured to store the charge photogenerated in third photodiode PD3 414-3 and fourth photodiode PD4 414-4, respectively. In the depicted example, charge photogenerated in third photodiode PD3 414-3 is configured to be transferred to first split floating diffusion FD_1 418-1 through a third transfer transistor TX3 416-3 and charge photogenerated in fourth photodiode PD4 414-4 is configured to be transferred to second split floating diffusion FD_2 418-2 through a fourth transfer transistor TX4 416-4.

As shown in the depicted example, a third shared gate structure SGS 430-3 includes a gate electrode of third transfer transistor TX3 416-3 and a fourth shared gate structure SGS 430-4 includes a gate electrode of fourth transfer transistor TX4 416-4. In the depicted example, the gate electrode of the third transfer transistor TX3 416-3 and the gate electrode of the fourth transfer transistor TX4 416-4 are disposed over a surface of the semiconductor material 460. As shown in the depicted example, a source follower transistor SF 420 is disposed in the semiconductor material 460 between the first split floating diffusion FD_1 418-1 and the second split floating diffusion FD_2 418-2. In the depicted example, a gate electrode of the source follower transistor SF 420 is also disposed over a surface of the semiconductor material 460. In the example, a thin gate oxide 440 is disposed between the gate electrodes of the third and fourth transfer transistors TX3 416-3 and TX4 416-4, as well as the gate electrode of the source follower transistor SF 420, and the surface of the semiconductor material 460. In one example, the thin gate oxide 440 has a thickness of approximately 30-80 Angstroms.

In the depicted example, a conductor 432 is disposed over the gate of the source follower transistor SF 420, the first split floating diffusion FD_1 418-1, and the second split floating diffusion FD_2 418-2 as shown. In the example, the conductor 432 is implemented with a metal 1 interconnect that is disposed in an interlayer dielectric 438 that is disposed over the gate electrodes of the transistors as well as over the surface of semiconductor material 460 as shown. In the example, the conductor 432 is coupled through the interlayer dielectric 438 to the gate of the source follower transistor SF 420, the first split floating diffusion FD_1 418-1, and the second split floating diffusion FD_2 418-2 through contacts 442 as shown. As such, the gate of the source follower transistor SF 420 is coupled to the first and second split floating diffusions FD_1 418-1 and FD2 418-2 through the contacts 442 and conductor 432. In the depicted example, the third shared gate structure SGS 430-3 is coupled to receive the third transfer control signal TX_N+1_O 434-3 and the fourth shared gate structure SGS 430-4 is coupled to receive the fourth transfer control signal TX_N+1_E 434-4 through their respective contacts 442 through the interlayer dielectric 438 as shown. In some embodiments, conductor 432 may not be disposed as metal 1 interconnect and can be a metal interconnect in other metal layers, e.g., metal 2 or within interlayer dielectric 438. In some embodiments, conductor 432 may be polysilicon-based interconnect embedded in the interlayer dielectric 438, e.g., an extension of the gate of the source follower transistor SF 420.

As shown in the depicted example, pixel circuit 404 also includes a plurality of isolation structures. For instance, as shown FIG. 4, a first isolation structure is disposed in the semiconductor material 460 between the first split floating diffusion FD_1 418-1 and the source/drain (e.g., S/D) region of the source follower transistor SF 420, which includes a shallow trench isolation (e.g., STI) structure 444 disposed in a well isolation region 436. A second isolation structure is also disposed in the semiconductor material 460 between the second split floating diffusion FD_2 418-2 and the source/drain (e.g., S/D) region of the source follower transistor SF 420, which also includes a shallow trench isolation (e.g., STI) structure 444 disposed in a well isolation region 436.

In the example, the shallow trench isolation (e.g., STI) structures 444 are disposed proximate to a front side of the semiconductor material 460. The depth of each shallow trench isolation (e.g., STI) structure 444 with respect to a surface (e.g., front side surface) of the semiconductor material 460 may be greater than a junction depth of either the first split floating diffusion FD_1 418-1 or the second split floating diffusion FD_2 418-2. The depth of each shallow trench isolation (e.g., STI) structure 444 may be greater than a junction depth of the source/drain region of the source follower transistor SF 420.

In the depicted example, additional isolation structures are also disposed in the semiconductor material 460 to isolate the photodiodes, including third photodiode PD3 414-3 and fourth photodiode PD4 414-4, from surrounding circuit elements. For example, as shown FIG. 4, a third isolation structure is disposed in semiconductor material 460 proximate to third photodiode PD3 414-3, which includes a deep trench isolation (e.g., DTI) structure 446 disposed in a well isolation region 448, and a fourth isolation structure is disposed in semiconductor material 460 proximate to fourth photodiode PD4 414-4, which also includes a deep trench isolation (e.g., DTI) structure 446 disposed in a well isolation region 448. In the example, the deep trench isolation (e.g., DTI) structures 446 are disposed proximate to a back side of the semiconductor material 460. In the example shown in FIG. 4, the photodiodes (e.g., PD3 414-3 and PD4 414-4) are disposed between the DTI structures 446 and the respective first and second split floating diffusions FD_1 418-1 and FD2 418-2. The well isolation regions 436 and 448 are doped well regions having a conductivity type opposite to that of the photodiodes (e.g., PD3 414-3 and PD4 414-4), the source/drain (e.g., S/D) region of the source follower transistor SF 420 as well as the first split floating diffusion FD_1 418-1 or the second split floating diffusion FD_2 418-2. In the examples, the well isolation regions 436 and 448 include P-type doped semiconductor material.

Figure 5:
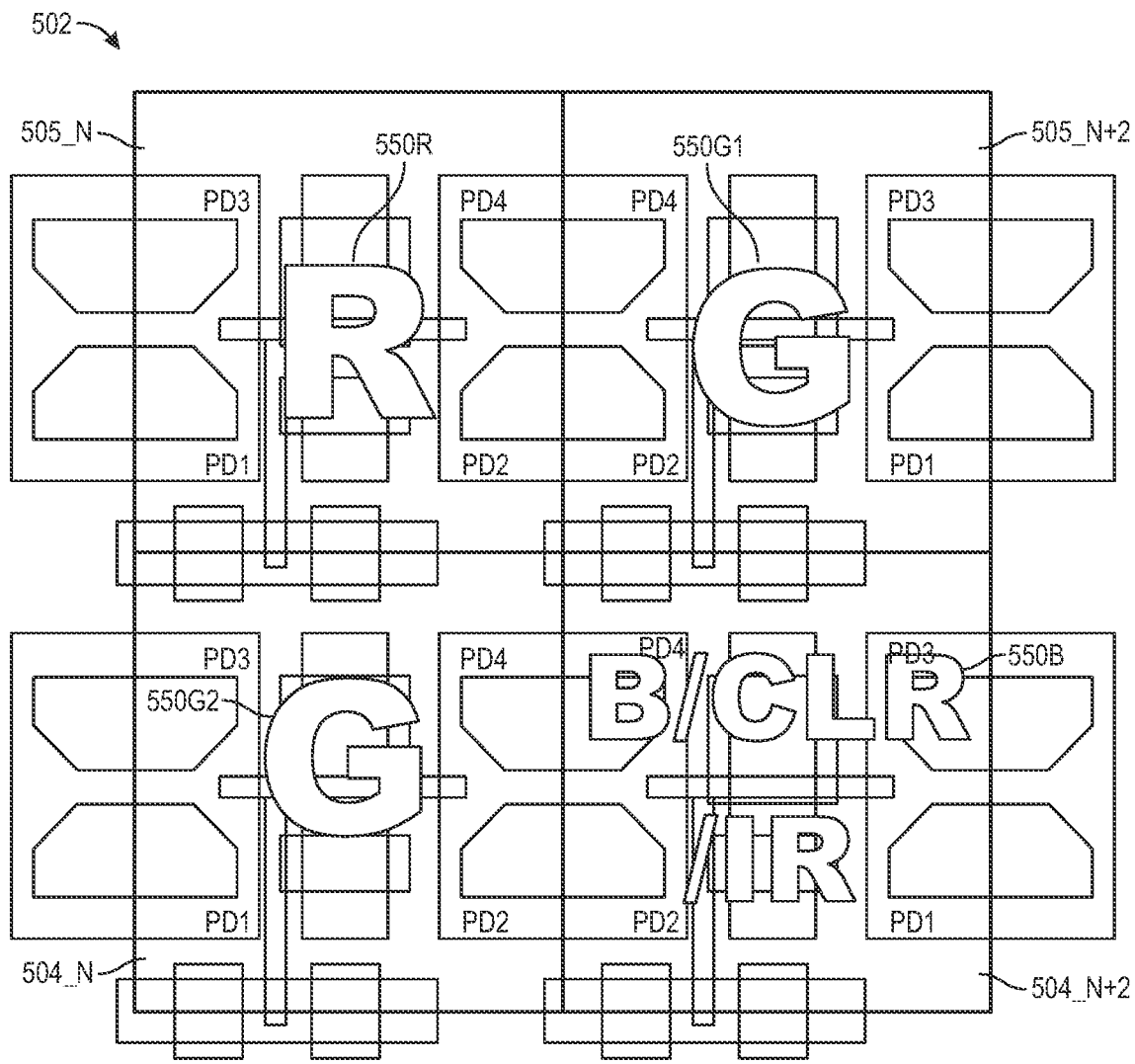
FIG. 5 illustrates various example patterns of color filter arrays disposed over a pixel array including arrangements of pixel circuits having shared gate structures with split floating diffusions included in a pixel array in accordance with the teachings of the present invention.

FIG. 5 illustrates various example patterns of color filter arrays disposed over a pixel array 502 that includes arrangements of pixel circuits having shared gate structures with split floating diffusions in accordance with the teachings of the present invention. It is appreciated that the example pixel array 502 and pixel circuits depicted in FIG. 5 may be examples of the example pixel arrays and/or pixel circuits depicted in FIGS. 1, 2A-2B, 3B-3C, 4 above and that similarly named and numbered elements described above are coupled and function similarly below.

As shown in the example depicted in FIG. 5, pixel array 502 includes an array of pixel circuits, including pixel circuits 504_N, 504_N+2, 505_N, and 505_N+2. It is appreciated that each of the pixel circuits 504_N, 504_N+2, 505_N, and 505_N+2 is substantially similar to the pixel circuits discuss above. Accordingly, each of the pixel circuits 504_N, 504_N+2, 505_N, and 505_N+2 shown in FIG. 5 includes a 2×2 arrangement of four photodiodes PD1, PD2, PD3, and PD4 as shown. In the example, a color filter array is disposed over pixel array 502 such that each of the photodiodes PD1, PD2, PD3, and PD4 of each pixel circuit 504_N, 504_N+2, 505_N, and 505_N+2 is configured to be illuminated with the incident light through a respective one of the color filters of the color filter array disposed over the pixel array 502. In the various examples, the color pixel array includes a mosaic of color filters arranged in a pattern, such as for example a Bayer filter, etc.

In the example illustrated in FIG. 5, the color filter array disposed over the pixel array 502 includes a first color filter 550R disposed over the pixel circuit 505_N, a second color filter 550G1 disposed over pixel circuit 505_N+2, a third color filter 550G2 disposed over pixel circuit 504_N, and a fourth color filter 550B disposed over pixel circuit 504_N+2. In the depicted example, the first color filter 550R is a red (R) color filter and the second color filter 550G1 and the third color filter 550G2 are green color filters. In one example, the fourth color filter 550B may be a blue (B) color filter. In another example, the fourth color filter 550B may be a clear (CLR) color filter. In yet another example, the fourth color filter 550B may be an infrared (IR) color filter.

It is appreciated that in each of the examples depicted in FIG. 5, all of four of the photodiodes PD1, PD2, PD3, and PD4 of each respective pixel circuit 504_N, 504_N+2, 505_N, and 505_N+2 are configured to receive incident light through the same respective one of the color filters 550G2, 550B, 550R, or 550G1. Thus, in an example in which the fourth color filter 550B is a blue (B) color filter, all four photodiodes PD1, PD2, PD3, and PD4 of pixel circuit 504_N+2 are configured to receive incident light that has been filtered with a blue color filter 550B. Similarly, all four photodiodes PD1, PD2, PD3, and PD4 of pixel circuit 505N are configured to receive incident light that has been filtered with a red color filter 550R. Similarly, all four photodiodes PD1, PD2, PD3, and PD4 of pixel circuit 504_N and all four photodiodes PD1, PD2, PD3, and PD4 of pixel circuit 504_N+2 are configured to receive incident light that has been filtered with green color filters 550G1 and 550G2.

Figure 6A:
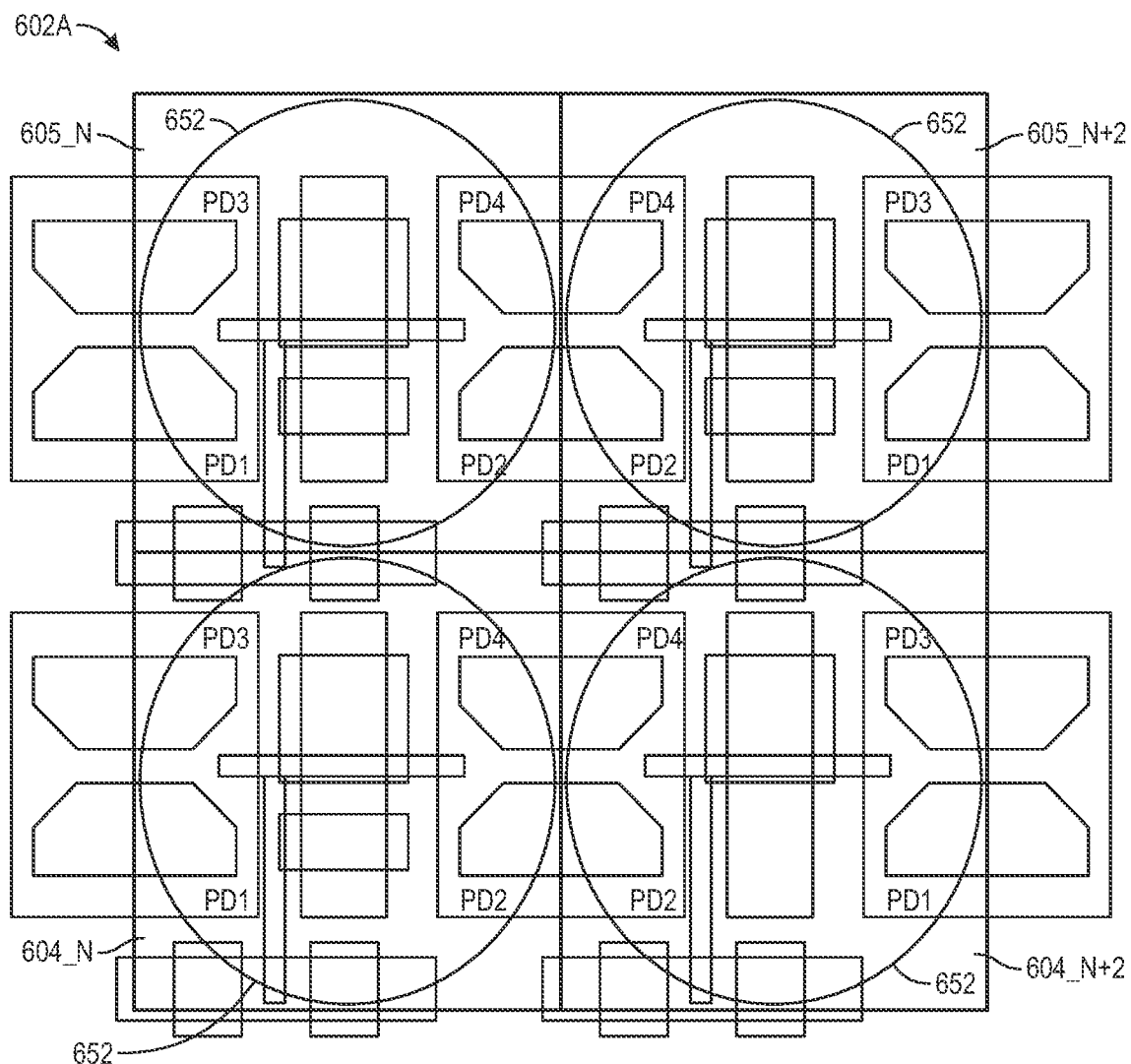
FIG. 6A illustrates an example of microlenses disposed over arrangements of pixel circuits having shared gate structures with split floating diffusions included in a pixel array in accordance with the teachings of the present invention.

FIG. 6A illustrates an example of microlenses disposed over a pixel array 602A that includes arrangements of pixel circuits having shared gate structures with split floating diffusions in accordance with the teachings of the present invention. It is appreciated that the example pixel array 602A and pixel circuits depicted in FIG. 6A may be examples of the example pixel arrays and/or pixel circuits depicted in FIGS. 1, 2A-2B, 3B-3C, 4-5 above and that similarly named and numbered elements described above are coupled and function similarly below.

As shown in the example depicted in FIG. 6A, pixel array 602A includes an array of pixel circuits, including pixel circuits 604_N, 604_N+2, 605_N, and 605_N+2. It is appreciated that each of the pixel circuits 604_N, 604_N+2, 605_N, and 605_N+2 is substantially similar to the pixel circuits discuss above. Accordingly, each of the pixel circuits 604_N, 604_N+2, 605_N, and 605_N+2 shown in FIG. 6A includes a 2×2 arrangement of four photodiodes PD1, PD2, PD3, and PD4 as shown.

In the example, a microlens array including a plurality of microlenses 652 is disposed over pixel array 602A such that each of the photodiodes PD1, PD2, PD3, and PD4 of each pixel circuit 604_N, 604_N+2, 605_N, and 605_N+2 is configured to be illuminated with the incident light through a respective one of the microlenses 652 of the microlens array disposed over the pixel array 602A as shown. In other words, in the example depicted in FIG. 6A, the each microlens 652 is disposed over the 2×2 arrangement of first, second, third, and fourth photodiodes PD1, PD2, PD3, and PD4 of each pixel circuit 604_N, 604_N+2, 605_N, and 605_N+2.

Figure 6B:
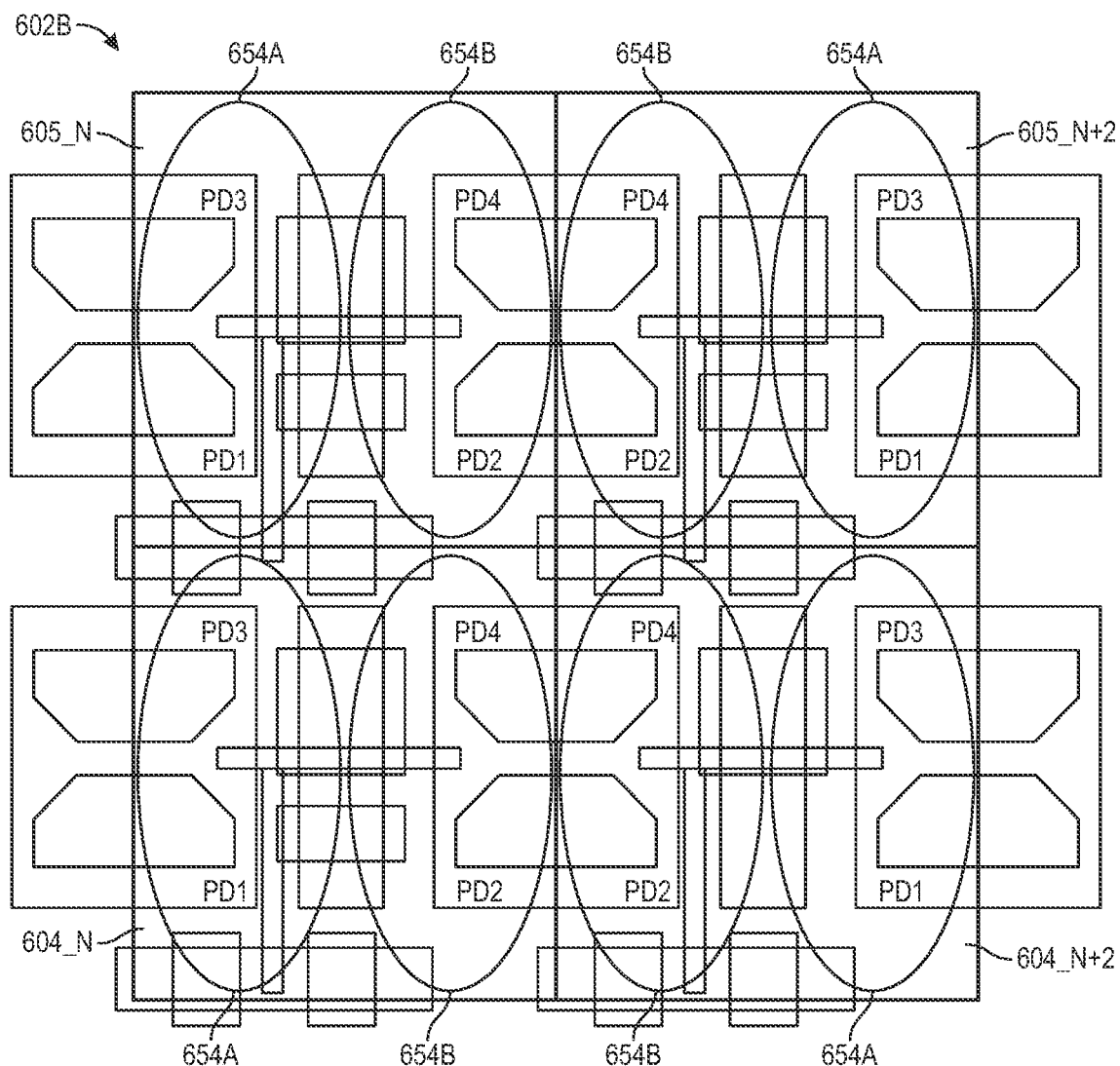
FIG. 6B illustrates another example of microlenses disposed over arrangements of pixel circuits having shared gate structures with split floating diffusions included in a pixel array in accordance with the teachings of the present invention.

FIG. 6B illustrates another example of microlenses disposed over a pixel array 602B that includes arrangements of pixel circuits having shared gate structures with split floating diffusions in accordance with the teachings of the present invention. It is appreciated that the example pixel array 602B and pixel circuits depicted in FIG. 6B may be examples of the example pixel arrays and/or pixel circuits depicted in FIGS. 1, 2A-2B, 3B-3C, 4-5 above and that similarly named and numbered elements described above are coupled and function similarly below.

As shown in the example depicted in FIG. 6B, pixel array 602B includes an array of pixel circuits, including pixel circuits 604_N, 604_N+2, 605_N, and 605_N+2. It is appreciated that each of the pixel circuits 604_N, 604_N+2, 605_N, and 605_N+2 is substantially similar to the pixel circuits discuss above. Accordingly, each of the pixel circuits 604_N, 604_N+2, 605_N, and 605_N+2 shown in FIG. 6B includes a 2×2 arrangement of four photodiodes PD1, PD2, PD3, and PD4 as shown.

In the example, a microlens array including a plurality of microlenses 654A, 654B is disposed over pixel array 602B such that each of the photodiodes PD1 and PD3 of each pixel circuit 604_N, 604_N+2, 605_N, and 605_N+2 is configured to be illuminated with the incident light through a respective one of the microlenses 654A of the microlens array as shown, and each of the photodiodes PD2 and PD4 of each pixel circuit 604_N, 604_N+2, 605_N, and 605_N+2 is configured to be illuminated with the incident light through a respective one of the microlenses 654B of the microlens array as shown. In other words, it is appreciated that first, second, third, and fourth photodiodes PD1, PD2, PD3, and PD4 of each pixel circuit 604_N, 604_N+2, 605_N, and 605_N+2 is divided into 1×2 arrangements of photodiodes, where a first 1×2 arrangement includes first and third photodiodes PD1 and PD3 and the second 1×2 arrangement includes second and fourth photodiodes PD2 and PD4. In the example, the microlenses 654A are disposed over each first 1×2 arrangement that includes first and third photodiodes PD1 and PD3, and the microlenses 654B are disposed over each second 1×2 arrangement that includes second and fourth photodiodes PD2 and PD4 as shown.

Figure 6C:
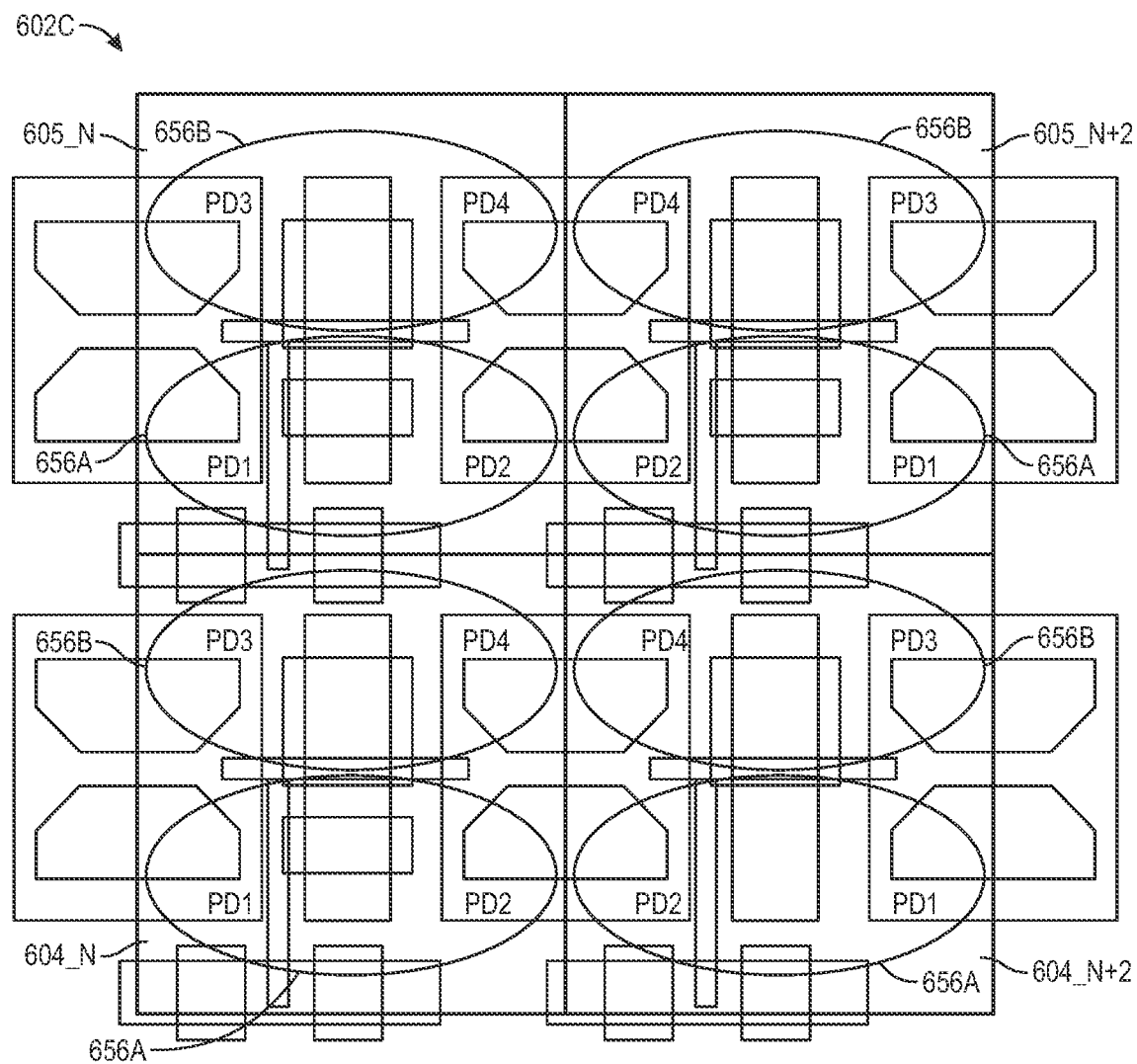
FIG. 6C illustrates yet another example of microlenses disposed over arrangements of pixel circuits having shared gate structures with split floating diffusions included in a pixel array in accordance with the teachings of the present invention.

FIG. 6C illustrates yet another example of microlenses disposed over a pixel array 602C that includes arrangements of pixel circuits having shared gate structures with split floating diffusions in accordance with the teachings of the present invention. It is appreciated that the example pixel array 602C and pixel circuits depicted in FIG. 6C may be examples of the example pixel arrays and/or pixel circuits depicted in FIGS. 1, 2A-2B, 3B-3C, 4-5 above and that similarly named and numbered elements described above are coupled and function similarly below.

As shown in the example depicted in FIG. 6C, pixel array 602C includes an array of pixel circuits, including pixel circuits 604_N, 604_N+2, 605_N, and 605_N+2. It is appreciated that each of the pixel circuits 604_N, 604_N+2, 605_N, and 605_N+2 is substantially similar to the pixel circuits discuss above. Accordingly, each of the pixel circuits 604_N, 604_N+2, 605_N, and 605_N+2 shown in FIG. 6C includes a 2×2 arrangement of four photodiodes PD1, PD2, PD3, and PD4 as shown.

In the example, a microlens array including a plurality of microlenses 656A, 656B is disposed over pixel array 602C such that each of the photodiodes PD1 and PD2 of each pixel circuit 604_N, 604_N+2, 605_N, and 605_N+2 is configured to be illuminated with the incident light through a respective one of the microlenses 656A of the microlens array as shown, and each of the photodiodes PD3 and PD4 of each pixel circuit 604_N, 604_N+2, 605_N, and 605_N+2 is configured to be illuminated with the incident light through a respective one of the microlenses 656B of the microlens array as shown. In other words, it is appreciated that first, second, third, and fourth photodiodes PD1, PD2, PD3, and PD4 of each pixel circuit 604_N, 604_N+2, 605_N, and 605_N+2 is divided into 2×1 arrangements of photodiodes, where a first 2×1 arrangement includes first and second photodiodes PD1 and PD2 and the second 2×1 arrangement includes third and fourth photodiodes PD3 and PD4. In the example, the microlenses 656A are disposed over each first 2×1 arrangement that includes first and second photodiodes PD1 and PD2, and the microlenses 656B are disposed over each second 2×1 arrangement that includes third and fourth photodiodes PD3 and PD4 as shown.

Figure 6D:
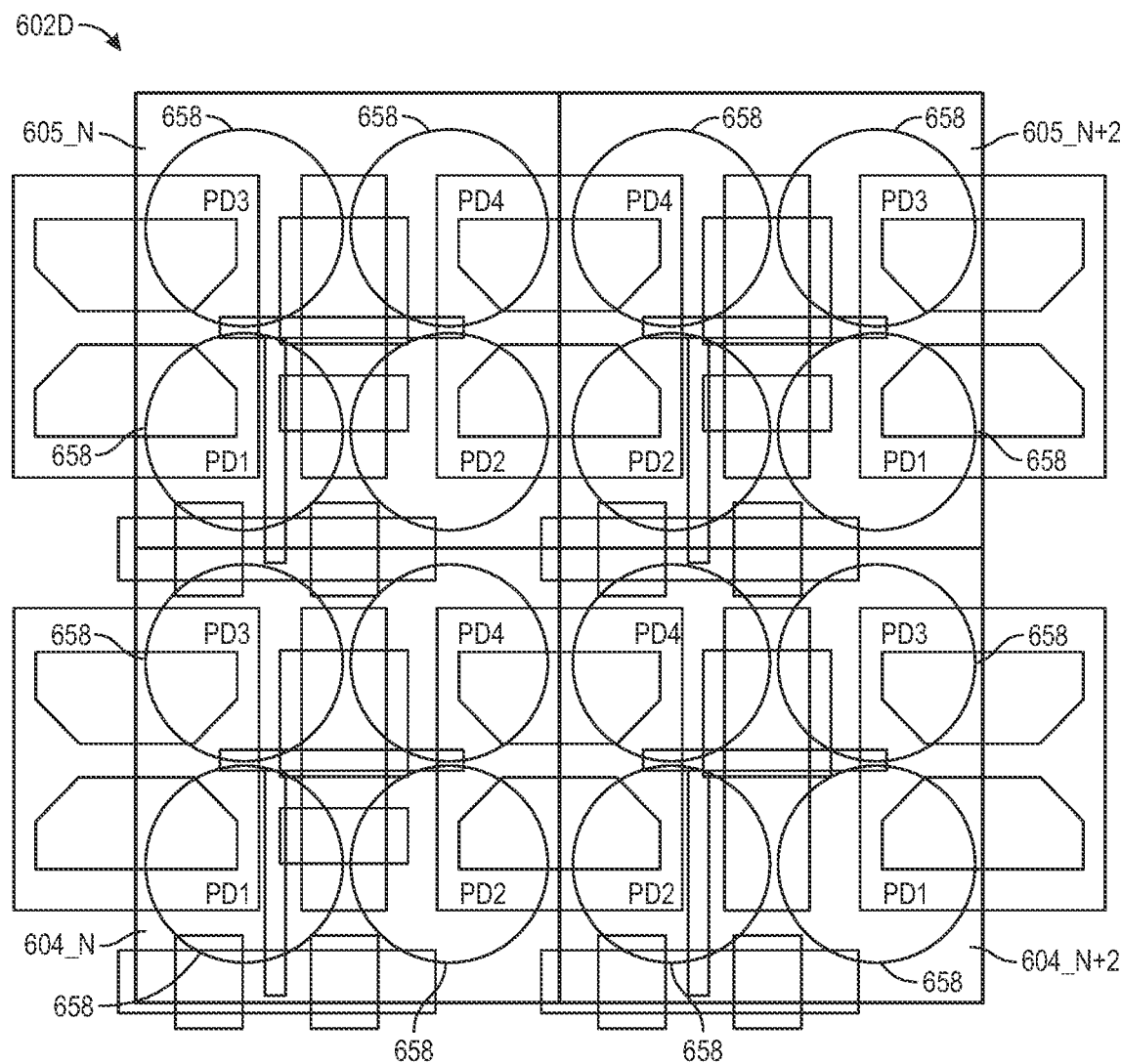
FIG. 6D illustrates still another example of microlenses disposed over arrangements of pixel circuits having shared gate structures with split floating diffusions included in a pixel array in accordance with the teachings of the present invention.

FIG. 6D illustrates still another example of microlenses disposed over a pixel array 602D that includes arrangements of pixel circuits having shared gate structures with split floating diffusions in accordance with the teachings of the present invention. It is appreciated that the example pixel array 602D and pixel circuits depicted in FIG. 6D may be examples of the example pixel arrays and/or pixel circuits depicted in FIGS. 1, 2A-2B, 3B-3C, 4-5 above and that similarly named and numbered elements described above are coupled and function similarly below.

As shown in the example depicted in FIG. 6D, pixel array 602D includes an array of pixel circuits, including pixel circuits 604_N, 604_N+2, 605_N, and 605_N+2. It is appreciated that each of the pixel circuits 604_N, 604_N+2, 605_N, and 605_N+2 is substantially similar to the pixel circuits discuss above. Accordingly, each of the pixel circuits 604_N, 604_N+2, 605_N, and 605_N+2 shown in FIG. 6D includes a 2×2 arrangement of four photodiodes PD1, PD2, PD3, and PD4 as shown.

In the example, a microlens array including a plurality of microlenses 658 is disposed over pixel array 602D such that each individual photodiode PD1, PD2, PD3, or PD4 of each pixel circuit 604_N, 604_N+2, 605_N, and 605_N+2 is configured to be illuminated with the incident light through a respective individual one of the microlenses 658 of the microlens array as shown. In other words, it is appreciated that first, second, third, and fourth photodiodes PD1, PD2, PD3, and PD4 of each pixel circuit 604_N, 604_N+2, 605_N, and 605_N+2 is divided into a respective individual 1×1 arrangement. In the example, each of the microlenses 658 is disposed over a respective one of the photodiodes PD1, PD2, PD3, or PD4 of each pixel circuit 604_N, 604_N+2, 605_N, and 605_N+2.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel array, comprising:
   a plurality of pixel circuits arranged into rows and columns, wherein a first pixel circuit of the plurality of pixel circuits includes:
   first, second, third, and fourth photodiodes disposed in a semiconductor material and configured to photo-generate charge in response to incident light;
   first, second, third, and fourth transfer transistors coupled to the first, second, third, and fourth photodiodes, respectively;

first and second split floating diffusions disposed in the semiconductor material, wherein the first split floating diffusion is coupled to receive the charge photogenerated by the first and third photodiodes through the first and third transfer transistors, respectively, wherein the second split floating diffusion is coupled to receive the charge photogenerated by the second and fourth photodiodes through the second and fourth transfer transistors, respectively; and first, second, third, and fourth shared gate structures, wherein the first shared gate structure comprises a gate of the first transfer transistor of the first pixel circuit and a gate of a first transfer transistor of a second pixel circuit of the plurality of pixel circuits, wherein the third shared gate structure comprises a gate of the third transfer transistor of the first pixel circuit and a gate of a third transfer transistor of the second pixel circuit, wherein the second shared gate structure comprises a gate of the second transfer transistor of the first pixel circuit and a gate of a second transfer transistor of a third pixel circuit of the plurality of pixel circuits, wherein the fourth shared gate structure comprises a gate of the fourth transfer transistor of the first pixel circuit and a gate of a fourth transfer transistor of the third pixel circuit.

2. The pixel array of claim 1, wherein the first pixel circuit is disposed in the semiconductor material between the second pixel circuit and the third pixel circuit.

3. The pixel array of claim 1, wherein the first pixel circuit further comprises a source follower transistor disposed in the semiconductor material between the first and second split floating diffusions.

4. The pixel array of claim 3, wherein the first pixel circuit further comprises:
a first isolation structure disposed in the semiconductor material between the first split floating diffusion and the source follower transistor; and
a second isolation structure disposed in the semiconductor material between the second split floating diffusion and the source follower transistor.

5. The pixel array of claim 4, wherein each one of the first and second isolation structures comprises:
a well isolation region disposed in the semiconductor material proximate to the source follower transistor; and
a shallow trench isolation (STI) structure disposed in the well isolation region proximate to a front side of the semiconductor material.

6. The pixel array of claim 3, wherein the first pixel circuit further comprises a conductor disposed over a gate of the source follower transistor and the first and second split floating diffusions, wherein the gate of the source follower transistor is coupled to the first and second split floating diffusions through the conductor.

7. The pixel array of claim 6, wherein the first pixel circuit further comprises a row select transistor coupled to the source follower transistor, wherein the row select transistor is disposed between the first and second split floating diffusions, wherein the source follower transistor and the row select transistor are coupled between a power line and a bitline.

8. The pixel array of claim 7, wherein the first pixel circuit further comprises a reset transistor coupled between the power line and the first and second split floating diffusions.

9. The pixel array of claim 8, wherein the conductor is further coupled between the first and second split floating diffusions and the reset transistor.

10. The pixel array of claim 9, wherein the first pixel circuit further comprises:
a capacitor; and
a dual floating diffusion transistor coupled between the capacitor and the first and second split floating diffusions,
wherein the conductor is further coupled between the first and second split floating diffusions and the dual floating diffusion transistor.

11. The pixel array of claim 1,
wherein the gate of the first transfer transistor of the first pixel circuit and the gate of the first transfer transistor of the second pixel circuit of the plurality of pixel circuits are coupled to be controlled in response to a first transfer control signal,
wherein the gate of the second transfer transistor of the first pixel circuit and the gate of the second transfer transistor of the third pixel circuit of the plurality of pixel circuits are coupled to be controlled in response to a second transfer control signal,
wherein the gate of the third transfer transistor of the first pixel circuit and the gate of the third transfer transistor of the second pixel circuit are coupled to be controlled in response to a third transfer control signal,
wherein the gate of the fourth transfer transistor of the first pixel circuit and the gate of the fourth transfer transistor of the third pixel circuit are coupled to be controlled in response to a fourth transfer control signal.

12. The pixel array of claim 1,
wherein the first shared gate structure is coupled to receive a first transfer control signal, wherein the first transfer control signal is coupled to be received by shared gate structures in odd numbered columns of the shared gate structures in the pixel array in a same row as the first and second gate structures,
wherein the second shared gate structure is coupled to receive a second transfer control signal, wherein the second transfer control signal is coupled to be received by shared gate structures in even numbered columns of the shared gate structures in the pixel array in the same row as the first and second gate structures,
wherein the third shared gate structure is coupled to receive a third transfer control signal, wherein the third transfer control signal is coupled to be received by shared gate structures in odd numbered columns of the shared gate structures in the pixel array in a same row as the third and fourth gate structures,
wherein the fourth shared gate structure is coupled to receive a fourth transfer control signal, wherein the fourth transfer control signal is coupled to be received by shared gate structures in even numbered columns of the shared gate structures in the pixel array in the same row as the third and fourth gate structures.

13. The pixel array of claim 12,
wherein the first transfer control signal is configured to readout the first photodiode before the second transfer control signal is configured to readout the second photodiode,
wherein the second transfer control signal is configured to readout the second photodiode before the third transfer control signal is configured to readout the third photodiode, wherein the third transfer control signal is configured to readout the third photodiode before the fourth transfer control signal is configured to readout the fourth photodiode.

14. The pixel array of claim 13,
wherein the first photodiode is configured to be readout during a first readout period in response to the first transfer control signal,
wherein the second photodiode is configured to be readout during a second readout period in response to the second transfer control signal, wherein the second readout period occurs after the first readout period,
wherein the third photodiode is configured to be readout during a third readout period in response to the third transfer control signal, wherein the third readout period occurs after the second readout period,
wherein the fourth photodiode is configured to be readout during a fourth readout period in response to the fourth transfer control signal, wherein the fourth readout period occurs after the third readout period.

15. The pixel array of claim 1, wherein the first, second, third, and fourth photodiodes are configured to be illuminated with the incident light through a first microlens.

16. The pixel array of claim 1,
wherein the first and third photodiodes are configured to be illuminated with the incident light through a first microlens,
wherein the second and fourth photodiodes are configured to be illuminated with the incident light through a second microlens.

17. The pixel array of claim 1,
wherein the first and second photodiodes are configured to be illuminated with the incident light through a first microlens,
wherein the third and fourth photodiodes are configured to be illuminated with the incident light through a second microlens.

18. The pixel array of claim 1,
wherein the first photodiode is configured to be illuminated with the incident light through a first microlens,
wherein the second photodiode is configured to be illuminated with the incident light through a second microlens,
wherein the third photodiode is configured to be illuminated with the incident light through a third microlens,
wherein the fourth photodiode is configured to be illuminated with the incident light through a fourth microlens.

19. The pixel array of claim 1, wherein the first, second, third, and fourth photodiodes are configured to be illuminated with the incident light through a first color filter of a color filter array disposed over the pixel array.

20. The pixel array of claim 19, wherein the first color filter of the color filter array is disposed over the first pixel circuit.

21. An imaging system, comprising:
a pixel array including a plurality of pixel circuits arranged into rows and columns, wherein a first pixel circuit of the plurality of pixel circuits includes:
first, second, third, and fourth photodiodes disposed in a semiconductor material and configured to photogenerate charge in response to incident light;
first, second, third, and fourth transfer transistors coupled to the first, second, third, and fourth photodiodes, respectively;
first and second split floating diffusions disposed in the semiconductor material, wherein the first split floating diffusion is coupled to receive the charge photogenerated by the first and third photodiodes through the first and third transfer transistors, respectively, wherein the second split floating diffusion is coupled to receive the charge photogenerated by the second and fourth photodiodes through the second and fourth transfer transistors, respectively; and
first, second, third, and fourth shared gate structures, wherein the first shared gate structure comprises a gate of the first transfer transistor of the first pixel circuit and a gate of a first transfer transistor of a second pixel circuit of the plurality of pixel circuits, wherein the third shared gate structure comprises a gate of the third transfer transistor of the first pixel circuit and a gate of a third transfer transistor of the second pixel circuit, wherein the second shared gate structure comprises a gate of the second transfer transistor of the first pixel circuit and a gate of a second transfer transistor of a third pixel circuit of the plurality of pixel circuits, wherein the fourth shared gate structure comprises a gate of the fourth transfer transistor of the first pixel circuit and a gate of a fourth transfer transistor of the third pixel circuit;
a control circuit coupled to the pixel array to control operation of the pixel array; and
a readout circuit coupled to the pixel array to readout image data from the pixel array.

22. The imaging system of claim 21, further comprising function logic coupled to the readout circuit to store the image data from the pixel array.

23. The imaging system of claim 21, wherein the first pixel circuit is disposed in the semiconductor material between the second pixel circuit and the third pixel circuit.

24. The imaging system of claim 21, wherein the first pixel circuit further comprises a source follower transistor disposed in the semiconductor material between the first and second split floating diffusions.

25. The imaging system of claim 24, wherein the first pixel circuit further comprises:
a first isolation structure disposed in the semiconductor material between the first split floating diffusion and the source follower transistor; and
a second isolation structure disposed in the semiconductor material between the second split floating diffusion and the source follower transistor.

26. The imaging system of claim 25, wherein each one of the first and second isolation structures comprises:
a well isolation region disposed in the semiconductor material proximate to the source follower transistor; and
a shallow trench isolation (STI) structure disposed in the well isolation region proximate to a front side of the semiconductor material.

27. The imaging system of claim 24, wherein the first pixel circuit further comprises a conductor disposed over a gate of the source follower transistor and the first and second split floating diffusions, wherein the gate of the source follower transistor is coupled to the first and second split floating diffusions through the conductor.

28. The imaging system of claim 27, wherein the first pixel circuit further comprises a row select transistor coupled to the source follower transistor, wherein the source follower transistor and the row select transistor are coupled between a power line and a bitline.

29. The imaging system of claim 28, wherein the first pixel circuit further comprises a reset transistor coupled between the power line and the first and second split floating diffusions.

30. The imaging system of claim 29, wherein the conductor is further coupled between the first and second split floating diffusions and the reset transistor.

31. The imaging system of claim 30, wherein the first pixel circuit further comprises:
a capacitor; and
a dual floating diffusion transistor coupled between the capacitor and the first and second split floating diffusions.

32. The imaging system of claim 31, wherein the conductor is further coupled between the first and second split floating diffusions and the dual floating diffusion transistor.

33. The imaging system of claim 21,
wherein the first shared gate structure is coupled to receive a first transfer control signal, wherein the first transfer control signal is coupled to be received by shared gate structures in odd numbered columns of the shared gate structures in the pixel array in a same row as the first and second gate structures,
wherein the second shared gate structure is coupled to receive a second transfer control signal, wherein the second transfer control signal is coupled to be received by shared gate structures in even numbered columns of the shared gate structures in the pixel array in the same row as the first and second gate structures,
wherein the third shared gate structure is coupled to receive a third transfer control signal, wherein the third transfer control signal is coupled to be received by shared gate structures in odd numbered columns of the shared gate structures in the pixel array in a same row as the third and fourth gate structures,
wherein the fourth shared gate structure is coupled to receive a fourth transfer control signal, wherein the fourth transfer control signal is coupled to be received by shared gate structures in even numbered columns of the shared gate structures in the pixel array in the same row as the third and fourth gate structures.

34. The imaging system of claim 33,
wherein the first transfer control signal is configured to readout the first photodiode before the second transfer control signal is configured to readout the second photodiode,
wherein the second transfer control signal is configured to readout the second photodiode before the third transfer control signal is configured to readout the third photodiode,
wherein the third transfer control signal is configured to readout the third photodiode before the fourth transfer control signal is configured to readout the fourth photodiode.

35. The imaging system of claim 34,
wherein the first photodiode is configured to be readout during a first readout period in response to the first transfer control signal,
wherein the second photodiode is configured to be readout during a second readout period in response to the second transfer control signal, wherein the second readout period occurs after the first readout period,
wherein the third photodiode is configured to be readout during a third readout period in response to the third transfer control signal, wherein the third readout period occurs after the second readout period,
wherein the fourth photodiode is configured to be readout during a fourth readout period in response to the fourth transfer control signal, wherein the fourth readout period occurs after the third readout period.

36. The imaging system of claim 21, wherein the first, second, third, and fourth photodiodes are configured to be illuminated with the incident light through a first microlens.

37. The imaging system of claim 21,
wherein the first and third photodiodes are configured to be illuminated with the incident light through a first microlens,
wherein the second and fourth photodiodes are configured to be illuminated with the incident light through a second microlens.

38. The imaging system of claim 21,
wherein the first and second photodiodes are configured to be illuminated with the incident light through a first microlens,
wherein the third and fourth photodiodes are configured to be illuminated with the incident light through a second microlens.

39. The imaging system of claim 21,
wherein the first photodiode is configured to be illuminated with the incident light through a first microlens,
wherein the second photodiode is configured to be illuminated with the incident light through a second microlens,
wherein the third photodiode is configured to be illuminated with the incident light through a third microlens,
wherein the fourth photodiode is configured to be illuminated with the incident light through a fourth microlens.

40. The imaging system of claim 21, wherein the first, second, third, and fourth photodiodes are configured to be illuminated with the incident light through a first color filter of a color filter array disposed over the pixel array.

41. The imaging system of claim 40, wherein the first color filter of the color filter array is disposed over the first pixel circuit.

* * * * *